(12) United States Patent
Wang et al.

(10) Patent No.: US 11,670,478 B2
(45) Date of Patent: Jun. 6, 2023

(54) MULTI-DEGREE-OF-FREEDOM SAMPLE HOLDER

(71) Applicant: Zhejiang University, Zhejiang (CN)

(72) Inventors: Hongtao Wang, Zhejiang (CN); Yizhi Zhang, Zhejiang (CN)

(73) Assignee: Zhejiang University, Hangzhou (CN)

( * ) Notice: Subject to any disclaimer, the term of this patent is extended or adjusted under 35 U.S.C. 154(b) by 173 days.

(21) Appl. No.: 17/334,870

(22) Filed: May 31, 2021

(65) Prior Publication Data

US 2021/0287874 A1 Sep. 16, 2021

Related U.S. Application Data

(63) Continuation of application No. PCT/CN2019/106864, filed on Sep. 20, 2019.

(30) Foreign Application Priority Data

| Nov. 30, 2018 | (CN) | 201811450173.8 |
| Nov. 30, 2018 | (CN) | 201811450175.7 |

(Continued)

(51) Int. Cl.
*H01J 37/20* (2006.01)
*G01N 23/04* (2018.01)

(52) U.S. Cl.
CPC .............. *H01J 37/20* (2013.01); *G01N 23/04* (2013.01); *G01N 2223/03* (2013.01); *G01N 2223/102* (2013.01); *H01J 2237/2007* (2013.01)

(58) Field of Classification Search
CPC .............. H01J 37/20; H01J 2237/2007; H01J 37/226; H01J 2237/20207;
(Continued)

(56) References Cited

U.S. PATENT DOCUMENTS 7,952,082 B2 * 5/2011 Sugizaki .................. G01N 1/32
250/492.1
11,295,929 B2 * 4/2022 Shukla ..................... H01J 37/20
(Continued)

FOREIGN PATENT DOCUMENTS

| CN | 102027562 A | 4/2011 |
| CN | 107576823 A | 1/2018 |

(Continued)

OTHER PUBLICATIONS

International Search Report of PCT Patent Application No. PCT/CN2019/106864 dated Dec. 26, 2019.
(Continued)

*Primary Examiner* — David A Vanore

(57) ABSTRACT

A multi-degree-of-freedom sample holder, comprising a housing and a rotating shaft, is disclosed. A frame is provided between the housing and the rotating shaft, and the frame is coaxial with the housing and rotating shaft. The present invention has multiple degrees of freedom such as high-precision translational freedom of the sample along the X-axis, Y-axis and Z-axis, and 360° rotation of the sample around the axis, etc. The sample is always aligned with the sample holder shaft during the rotation, and the static electricity accumulated on the sample can be led out.

22 Claims, 13 Drawing Sheets

(30) Foreign Application Priority Data

Nov. 30, 2018 (CN) .......................... 201811450184.6
Nov. 30, 2018 (CN) .......................... 201811450211.X

(58) Field of Classification Search
CPC ............. H01J 2237/20214; H01J 2237/20221;
H01J 2237/20264; H01J 2237/26; G01N
23/04; G01N 2223/03; G01N 2223/102;
H01L 41/092; H01L 41/0993; H02N
2/0095
See application file for complete search history.

(56) References Cited

U.S. PATENT DOCUMENTS

2021/0287874 A1* 9/2021 Wang ................... H01J 37/226
2022/0319802 A1* 10/2022 Nakamura ............ H01J 37/305

FOREIGN PATENT DOCUMENTS

| CN | 108172491 A | 6/2018 | |
|---|---|---|---|
| CN | 108550513 A | 9/2018 | |
| JP | 2020027692 A * | 2/2020 | ............ H01J 37/185 |
| JP | 6808691 B2 * | 1/2021 | ............ H01J 37/185 |
| WO | WO-2020108038 A1 * | 6/2020 | ............ G01N 23/02 |

OTHER PUBLICATIONS

Tang Ming-hua et al., Introduction to electron microscopy 3D reconstruction and its application in materials science, Journal of Chinese Electron Microscopy Society, Apr. 30, 2015, vol. 34, No. 2.

K. Svensson et al., Compact design of a transmission electron microscope-scanning tunneling microscope holder with three-dimensional coarse motion, Review of Scientific Instruments, 2003, vol. 74, No. 11.

* cited by examiner

| Type | Brand | Model | Driving capability | | | | | | 3D reconstruction capability Tilting positive and negative angle (degrees) | Extended functions |
|---|---|---|---|---|---|---|---|---|---|---|
| | | | X | Y | Z | α | β | γ | | |
| Sample holder with three-dimensional reconstruction | GATAN | Elsa™ 698 | X | X | X | X | X | X | 80 | Low temperature |
| | | 916 | X | X | X | X | X | X | 80 | |
| | | 927 | X | X | X | X | X | Single-step 90° | 75 | |
| | | 912 | X | X | X | X | X | X | 80 | |
| | Mel-Build | HATA-Holder | X | X | X | Single-step 15°×24 | ±15° | X | 80 | EDS |
| | | EN-Holder for UHR | X | X | X | X | ±15° | X | 90 | |
| | | SATO-Holder | X | X | X | X | X | X | | In-situ stretching/compression |
| | FISCHIONE | Model 2020 | X | X | X | X | X | X | 70 | |
| | | Model 2021 | X | X | X | X | X | X | | EDS |
| | | Model 2030 | X | X | X | X | X | X | 90 | Suitable for electron microscopes with small pole shoes |
| | | Model 2040 | X | X | X | X | X | Single-step 90° | 70 | |
| | | Model 2045 | X | X | X | X | X | Single-step 90° | 70 | |
| | | Model 2050 | X | X | X | Single-step 135°×2 | X | X | 60 | |
| | | Model 2550 | X | X | X | X | X | X | 80 | Low temperature |
| | | Model 2560 | X | X | X | X | X | X | 70 | Vacuum transfer |
| | FEI | CompuStage Rotation Holder | | X | X | X | X | X | 360 | |
| | | Single-Tilt Tomography Holder | X | X | X | X | X | X | 70 | |
| | | High Field-of-View Single-Tilt Tomography Holder | X | X | X | X | X | X | 70 | |
| | | 70° Tilt Cryo-transfer Holder | | X | X | X | X | X | 70 | |
| | | tomography | X | X | X | X | X | X | 80 | |
| Sample holder with nano-manipulation | HUMMINGBIRD | Nano-Manipulator | Rough adjustment with screws and fine adjustment with piezoelectricity | Rough adjustment with screws and fine adjustment with piezoelectricity | Rough adjustment with screws and fine adjustment with piezoelectricity | X | X | X | | Can be equipped with a variety of in-situ experimental accessories |
| | HYSITRON | PI95 | Rough adjustment with screws and fine adjustment with piezoelectricity | Rough adjustment with screws and fine adjustment with piezoelectricity | Rough adjustment with screws and fine adjustment with piezoelectricity | X | X | X | | Can be equipped with a variety of in-situ experimental accessories |
| | Nanofactory | Nanofactory | Full piezoelectric | Full piezoelectric | Full piezoelectric | X | X | X | | Can be equipped with a variety of in-situ experimental accessories |
| Four-degree-of-freedom sample holder | | | Full piezoelectric | Full piezoelectric | Full piezoelectric | Full piezoelectric ±10° | X | X | 360 | Can be equipped with a variety of in-situ experimental accessories |

FIG.23

MULTI-DEGREE-OF-FREEDOM SAMPLE HOLDER

CROSS REFERENCE TO RELATED APPLICATIONS

The present application is a Continuation Application of PCT Application No. PCT/CN2019/106864 filed on Sep. 20, 2019, which claims the benefit of Chinese Patent Application Nos. 201811450211.X; 201811450175.7, 201811450173.8, and 201811450184.6 filed on Nov. 30, 2018. All the above are hereby incorporated by reference in their entirety.

FIELD OF THE INVENTION

The present invention relates to a sample holder used under an electron microscope and a transmission electron microscope (TEM).

BACKGROUND

TEM can be used to observe fine structures smaller than 0.2 μm that cannot be seen under ordinary optical microscopes. These structures are called sub-microstructures or ultra-microstructures. In 1932, Ruska invented the TEM with electron beams as the light source. Currently, the resolution of TEM can be up to 0.2 nm.

It has a long history of in-situ observation technology used in the TEM research. By applying various physical effects on the samples and observing the changes in the microstructure and chemical state of the materials using TEM, the performance of study materials or devices can be intuitively studied in the actual uses, which is of important practical significance for the research of performance of materials. The in-situ technology of the transmission electron microscopy has the following difficulties: the physical action should be accurately applied to the samples, and a series of stringent conditions should be met, for example, it is necessary to maintain the ultra-high vacuum of the electron microscope system and ensure the extremely high stability of the sample tables, without interfering with the imaging light path, and the whole structure must be compact to be suitable for the small chambers of the transmission electron microscope, etc. Therefore, the difficulty of in-situ technology of the electron microscope mainly lies in the research and production of the in-situ sample holders.

The Swedish K. Svensson et al. disclosed a three-dimensional piezoelectric probe in the article "Compact design of a TEM-scanning tunneling microscope holder with three-dimensional coarse motion" published in 2003. The three-dimensional piezoelectric probe is a part of a sample holder of a transmission electron microscope. The piezoelectric probe includes a piezoelectric ceramic tube and a ball. The ball is fixed on the end of the piezoelectric ceramic tube. The ball is provided with a sample holder that can grasp the ball by a flexible screw claw. The piezoelectric ceramic tube controls the ball to make a cyclic motion of "slow moving and fast withdrawing" with small amplitude (less than 2.5 micrometers in the axial direction of the piezoelectric ceramic tube, and less than 30 micrometers in the other two directions). The flexible screw claw grips the ball by friction, the piezoelectric ceramic tube makes a cyclic motion, and the sample holder is shaken step by step by the friction between the flexible wire claw and the ball, resulting in displacement control (rough adjustment) of a larger displacement and larger step length. Combining with the small-displacement and continuously adjustable displacement control (fine adjustment) produced by the piezoelectric ceramic tube itself, precise displacement control of large displacement (about 3 mm) of three degrees of freedom can be accumulated in a small space (one degree of freedom for axial translation and two degrees of freedom for rotation around the ball) can be achieved accumulatively in a small space. This type of three-dimensional piezoelectric probe has been used in the U.S. FEI's NanoEx 3D STM/EP system and NanoEx 3D Indentor system, to realize in-situ STM, in-situ indentation and electrical prospecting under TEM.

The three-dimensional probes have the following advantages: firstly, the flexible screw claw is easy to deform. In order to maintain the friction with the ball, it is necessary to often adjust the shape of the flexible screw claw; however, there are multiple flexible screw claws, and the consistency of each flexible screw claw cannot be guaranteed. Thus, the reliability and accuracy of the three-dimensional probes become lower and lower with the time and frequency of uses. Secondly, the length of the flexible screw claw makes a gap between the sample holder and the ball. When the ball moves cyclically, the sample holder moves away from or close to the ball along the screw claw, thereby achieving the axial displacement of samples. However, the sample holder is hung on the ball through the flexible screw claw, and the sample holder and the samples thereon will fall downward under the action of gravity, with low position accuracy. The observation field of TEM is in the nanometer and micrometer range. The position deviation of the samples under the action of gravity may cause the to-be-observed (TBO) sample area to deviate from the observation field of the electron microscope, making it unable to be observed; in addition, the existence of position deviation makes it difficult to adjust the TBO sample area to a position and angle suitable for observation. Thirdly, when the probe holding device moves back and forth along the axial direction of the piezoelectric ceramic tube, the relationship between the shape of the flexible screw claw and the aforementioned frictional force is complicated, and it is difficult to ensure that the frictional force is always appropriate by adjusting its shape. In addition, the probe clamping device is affected by gravity, which makes it easy to produce coupling motion during rough adjustment and difficult to accurately control the probes. Furthermore, due to improper adjustment of the shape of the flexible screw claw, the ball cannot be grasped, which may cause the probe clamping device to fall into the device and lead to damage to the device.

SUMMARY

A multi-degree-of-freedom sample holder, wherein the sample holder is provided with a nanopositioner, the nanopositioner includes a piezoelectric ceramic tube and a joint ball. The joint ball is fixed on the end of the piezoelectric ceramic tube. The joint ball is provided with a clamping mechanism, the head end of the clamping mechanism is provided with a sample holder nozzle. The piezoelectric ceramic tube controls the joint ball to make a cyclic motion of "slow moving and fast withdrawing" with small amplitude. The f clamping mechanism grips the joint ball by friction, the piezoelectric ceramic tube makes a cyclic motion, and the sample holder nozzle is shaken step by step by the friction between the clamping mechanism and the joint ball, resulting in displacement control of a larger stroke and larger step length; by combining with the piezoelectric ceramic tube itself, a small-stroke, continuous adjustable displacement control is produced.

The first aspect of the present invention aims to provide a multi-degree-of-freedom sample holder that has accurate rotation around a small spherical surface and axial rotation of the sample holder, and has stable performance in repeated use.

A multi-degree-of-freedom sample holder, wherein the sample holder is provided with a nanopositioner, the nanopositioner includes a driving member, a joint ball and a pressing component assembly. The joint ball is fixed to the driving member. The pressing component assembly includes at least two pressing components and an elastic connecting component. The elastic connecting component connects the adjacent pressing component, the pressing component grips the joint ball, and there is a pre-tightening force between the pressing component and the joint ball. For example, a piezoelectric ceramic tube is used as a driving member. The driving member, the joint ball and the pressing component assembly constitute a clamping mechanism.

Pressing Component

The pressing component is used to grip the joint ball. When the piezoelectric ceramic tube (driving member) is not moving, the pressing component can stably support samples and sample holders. When the piezoelectric ceramic tube (driving member) is not moving, the friction between the pressing component and the joint ball enables the pressing component to rotate or swing cumulatively relative to the joint ball.

As a preferred embodiment, each pressing component has a recessed portion and a connecting portion, the elastic connecting component is arranged between connecting portions of the adjacent pressing component, and the recessed portions of all pressing components form a slot that mates with the joint ball. The slot and the joint ball are in line contact or surface contact or point contact; the elastic connecting component makes a pre-tightening force between the pressing component and the joint ball, when the joint ball is stationary or the driving member is moving slowly with the joint ball, the static friction between the joint ball and the pressing component makes the pressing component stationary relative to the joint ball. When the driving member quickly resets with the joint ball, a sliding friction is generated between the joint ball and the pressing component. When the joint ball is reset, the pressing component remains in the original place and does not reset with the joint ball, or although a reset motion is generated with the joint ball, the motion displacement is smaller than the reset displacement of the joint ball.

Preferably, the slot is hemispherical, or V-shaped, or conical.

Preferably, the pressing component is an integrated board, and the recessed portion is positioned in the center of the board.

Preferably, the first pressing component and the second pressing component are respectively positioned on both sides of the joint ball. Or, the first pressing component is on the top, the second pressing component is on the bottom, and the slot of the second pressing component is a through hole. The inner wall of the through hole is hemispherical, V-shaped, or conical. Preferably, the first pressing component is provided with a sample fixture.

Preferably, the pressing component is positioned outside of the joint ball. When the sample holder is placed upright, the nanopositioner faces upwards, and when the sample holder is placed upright on both sides, the left and right sides, front and back sides are the outer sides. Preferably, a sample holding portion is arranged on the pressing component. When all the pressing components are assembled in place, the sample holding portion is combined into a sample fixture, and the sample fixture is used to install samples. When mounting, the pressing component is used to grip the joint ball from both sides of the joint ball, and the elastic connecting component provides the pre-tightening force between the pressing component and the joint ball.

As a preferred embodiment, a pressing component includes a first pressing component and a second pressing component. A plurality of mounting positions are evenly distributed around the recessed portion of the first pressing component and the recessed portion of the second pressing component, and each mounting position is corresponding to an elastic connecting component, and the mounting position of the first pressing component is aligned with the mounting position of the second pressing component. Thus, one end of the elastic connecting component is mounted in the mounting position of the first pressing component, and the other end is mounted in the mounting position of the second pressing component.

As a preferred embodiment, the slot surface of the first pressing component is provided with a wear-resistant layer. Preferably, the slot surface of the second pressing component is provided with a wear-resistant layer.

Elastic Connecting Component

The elastic connecting component is used to provide pressure between the pressing component and the joint ball.

As a preferred embodiment, the elastic connecting component is an elastic column made of spring or elastic material (such as a silica gel column, a rubber column, etc.), one end of the elastic connecting component is fixed with the first pressing component, and the other end is fixed with the second pressing component. After the two pressing components grip the joint ball, the elastic connecting component is in a deformed state, and the restoring force of the elastic connecting component provides the pre-tightening force between the two pressing components and the joint ball.

Or, the elastic connecting component is composed of a screw rod and a spring. The spring is sleeved on the screw rod. The spring is positioned between the screw rod and the first pressing component. The mounting position of the second pressing component is the screw hole that engages with the screw rod. After the screw rod is engaged with the mounting position of the second pressing component, the spring is in a compressed state, the spring pushes the first pressing component to the second pressing component, and the spring provides a pre-tightening force between the first pressing component, the second pressing component and the joint ball.

Preferably, the mounting position of the first pressing component is a through hole, and the through hole is in clearance fit with the screw rod. There is no friction between the through hole and the screw rod, which facilitates the spring to push the first pressing component.

Preferably, the screw rod extends out of the mounting hole of the second pressing component, or a fixing portion is provided between the screw rod and the second pressing component. For example, after the second pressing component is mounted in place, the screw rod and the second pressing component are fixed by soldering or bonding, etc., or the threads on the screw rod are damaged. When the joint ball cyclically moves to drive the displacement of the first pressing component and the second pressing component, the shaking of the first pressing component and the second pressing component will cause vibration between the screw rod and the second pressing component, causing the screw rod to loosen or even detach from the second pressing component; the loosening of the screw rod will affect the precise control of the position; when the screw rod detaches from the second pressing component, it will cause the first pressing component and the sample to fall and damage the electron microscope.

The screw rod and spring are used to adjust the pre-tightening force between the pressing component and the joint ball according to the tightening degree of the screw rod, reducing the design and manufacturing requirements for elasticity itself.

Driving Member

The second aspect of the present invention aims to provide a driving member structure capable of driving samples to swing or rotate at multiple angles around the spherical surface of the joint ball. The driving member is a piezoelectric ceramic tube, and a conductive area is arranged on the piezoelectric ceramic tube to control the swing direction of the pressing component, the sample holder, and samples relative to the joint ball.

As a preferred embodiment, the driving member is a piezoelectric ceramic tube. The piezoelectric ceramic tube is a hollow tube. One end of the piezoelectric ceramic tube is fixed with the joint ball, and the other end is mounted on the sample holder; the piezoelectric ceramic tube has an inner surface and an outer surface, and a plurality of conductive area groups are provided on one surface of the piezoelectric ceramic tube, each conductive area group includes two symmetrical conductive areas, all conductive areas are independent of each other, and each conductive area has a conductive wire; the other surface of the piezoelectric ceramic tube is a whole area conductive portion. The whole area conductive portion means that the conductive coating completely covers another surface.

Preferably, the conductive area group is arranged on the outer surface of the piezoelectric ceramic tube, and the whole area conductive portion is arranged on the inner surface of the piezoelectric ceramic tube. Alternatively, the conductive area group is arranged on the inner surface of the piezoelectric ceramic tube, and the whole area conductive portion is arranged on the outer surface of the piezoelectric ceramic tube. For example, when the conductive area group is evenly distributed along the outer (inner) surface of the piezoelectric ceramic tube, the whole area conductive portion covers the inner (outer) surface.

Preferably, an insulating coating is provided between adjacent conductive areas.

Preferably, the voltage directions of two conductive areas of each conductive area group are opposite.

As a preferred embodiment, the joint ball is connected to the piezoelectric ceramic tube through a ball seat. The ball seat includes a connecting rod fixed to the joint ball and a connecting base fixed to the piezoelectric ceramic tube. The diameter of the connecting rod is smaller than the diameter of the joint ball.

As a preferred embodiment, the connecting rod and the connecting base are detachably fastened and connected, for example, a threaded connection, a key connection, etc. When mounting, the connecting rod passes through the slot through hole of the second pressing component, the slot of the second pressing component is in contact with the joint ball, and then the connecting rod is fixed with the connecting base. As a result, the disassembly and replacement of the second pressing component are convenient.

Lead-Out of Static Electricity

The third aspect of the present invention is to provide a sample holder that can lead out the static electricity accumulation caused by the electron beam imaging in the TEM.

Since the TEM uses electron beam imaging, when the electron beams irradiate samples, static electricity will be accumulated on the TBO sample area to generate an electrostatic field. The electrostatic field will deflect the electron beams and affect the electron beam imaging Therefore, it is necessary to lead out the static electricity on TBO sample area.

As a preferred embodiment, when the sample is a conductor or semiconductor, the head end of the nano-actuator is provided with a casing for loading samples, the casing is provided with a pre-tightening screw for locking samples, the nano-actuator is provided with an electrostatic lead-out component. Both the pre-tightening screw and the electrostatic lead-out component are conductive. An electrical path that communicates with the pre-tightening screw and the electrostatic lead-out component is arranged on the nano-actuator, the electrostatic lead-out component is connected to the wire, the wire is grounded, or connected to the constant voltage power supply provided by the external device, or connected to the shaft of the sample holder, and then to the TEM. By this way, the static electricity on the TBO sample area is transmitted to the pre-tightening screw through the samples, and the pre-tightening screw reaches the electrostatic lead-out component through the electrical path on the nano-actuator, and the current on the electrostatic lead-out component is led out through the wire.

Preferably, the electrical path may be a wire connecting the pre-tightening screw and the electrostatic lead-out component, and it is only necessary to set the length of the wire redundantly such that the wire does not affect the motion of the nano-actuator. Or, the nano-actuator adopts the above-mentioned structure, the casing is arranged on the first pressing component, the electrostatic lead-out component is fixedly mounted on the second pressing component, the first pressing component, the casing and the second pressing component are all conductors. At least one elastic connecting component is provided between the first pressing component and the second pressing component. The elastic connecting component includes a screw rod and a spring. Both the screw rod and the spring are conductors. The surface of the through hole corresponding to the first pressing component and the screw rod remains conductive. Thus, the flow direction of static electricity is as follow: sample→pre-tightening screw→first pressing component→spring→screw rod→second pressing component→electrostatic lead-out component.

Preferably, the electrostatic lead-out component is a conductive screw, the second pressing component is provided with a screw hole mating with the conductive screw, and the nut of the conductive screw is in the direction away from the first pressing component, the wire is positioned between the nut of the conductive screw and the second pressing component. Thus, the mounting of the conductive screw is facilitated, and the wire is fixed to the conductive screw. Or, the wire is welded to the conductive screw, and the wire is directly welded to the conductive screw to make the wire connection more stable.

Preferably, the screw rod portion of the conductive screw is positioned in the second pressing component. In other words, except for the head portion, the remaining part of the conductive screw is positioned in the second pressing component, and its tail portion does not extend out of the second pressing component, nor screw into the first pressing component. Thus, the influence of the relative motion between the first pressing component, the joint ball and the second pressing component on the stability of the conductive screw is avoided.

Preferably, the head portion of the conductive screw is exposed to the second pressing component. In this way, the wire can be pressed tightly between the conductive screw and the surface of the second pressing component, the wire does not need to be embedded in the screw hole of the second pressing component, and the wire is not easily broken.

Preferably, the tail portion of the conductive screw is fixed with the second pressing component by spot welding. The conductive screw is fixed in the second pressing component by the spot welding, to maintain the stability of current transmission, and prevent the conductive screw from falling off the second pressing component and falling. TEM is very expensive and difficult to maintain. Once parts or samples fall in the sample chamber of the TEM, it will cause gripe losses, and the sample chamber space is limited, and the dropped parts are difficult to take out. Therefore, the reliability of the connection of each part of the sample holder is very important.

Sample Holder Nozzle

The fourth aspect of the present invention aims to provide a sample holder that can stably clamp samples of various thicknesses and types and can always stably appear in the observation field of the TEM.

Samples need to be loaded on the sample holder through the sample holder nozzle. For example, the sample is a rod with a diameter of 0.3 mm and a length of 10 mm. The TBO sample area is an area with a thickness of less than 100 nm at one end of the sample, for example, a needle tip or attached nanoparticles. There may be multiple areas to be observed on each sample. When conducting sample observation experiment, the samples rotate around the axis. In order to keep the TBO sample area always within the observation field of the TEM, the TBO sample area should be as close as possible to the rotating shaft. The usual way to mount samples is to provide a casing at the front end of the sample holder, and the locking screw presses the sample against the wall of the casing from one side. To make samples to be loaded into the casing smoothly and non-destructively, the inner diameter of the casing needs to be thicker than the sample. Therefore, the TBO sample area will inevitably deviate from the center axis of the sample holder. However, the observation scale of TEM is usually micron or nanometer. When observing the TBO sample area, it is likely that the TBO sample area is beyond the observation field of the TEM after the piezoelectric rubbing mechanism rotates the sample. In order to be able to observe samples of various sizes, a sample holder nozzle is arranged to mount the sample, and the sample and sample holder nozzle are mounted as sample components into the front end of the sample holder.

As a preferred embodiment, the sample holder nozzle includes a clamping portion and a connecting portion, and the sample is loaded on the clamping portion. When clamping the sample, samples are partially inserted into a copper tube, then the inserted copper tube is clamped at one end with tools (such as pliers, etc.) to make the inner surface of the copper tube to fit the samples to form an arch as the clamping portion, thereby the samples are limited at the arch to complete the assembly of the samples with the sample holder nozzle. The connecting portion of the sample holder nozzle is in clearance fit with the casing, for example, if the casing is circular, the connecting portion of the sample holder nozzle is cylindrical, as long as the connecting portion can be in clearance fit with the casing. Thus, the pre-tightening screw directly abuts tightly the sample holder nozzle, samples of any size can be mounted on the sample holder nozzle, and then the sample components are mounted on the sample holder. In this way, the sample holder can be loaded with good versatility. The pre-tightening screw just needs to abut the sample holder nozzle. The pre-tightening screw does not touch the sample nor cause damage to the sample; in addition, the mounting clearance between the sample holder nozzle and the sample holder can be arranged as small as possible to ensure that the sample is as close as possible to the axis of the sample holder.

Preferably, a sample loading hole is provided in the midline position of the clamping portion. The sample loading hole is arranged at the midline position of the clamping portion, which facilitates the balanced clamping of the sample.

Preferably, a buffer gap that is in communication with the sample loading hole is opened on two sides of the sample loading hole symmetrically. When the size of the sample loading hole is smaller than the sample size, the buffer gap can make the sample loading hole to have a space with increased size, such that the sample can be smoothly loaded into the sample loading hole.

Preferably, the clamping portion gradually shrinks from the bottom to the top, the top is flat, and the clamping portion is hollow. The flat top reduces the space occupied by the sample holder nozzle, to facilitate sample handling. The hollow clamping portion increases the extension length of the sample.

Preferably, the clamping portion and the connecting portion are fixedly connected or integrally formed, with the clamping portion on the upper side and the connecting portion on the lower side. The fixed connection method can be welding. The integral formation method can ensure smooth connection between the clamping portion and the connecting portion.

Preferably, the connecting portion is a solid column, or the connecting portion is hollow. The solid column is not prone to squeeze deformation, and the pre-tightening screw resists the solid column to maintain the reliability of the mounting of the sample and the sample holder nozzle. When the connecting portion is hollow, the extension length of the sample is further increased, and the manufacturing cost of the clamping nozzle is reduced.

Preferably, a pit is provided on the connecting portion. The pre-tightening screw is correspondingly inserted into the pit of the connecting portion, which can prevent the sample from rotating and displacing while locking the connecting portion.

Preferably, the sample holder nozzle is a conductor, which facilitates the discharge of static electricity accumulated on the TBO sample area.

Preferably, the sample holder nozzle may be a thin-walled copper tube. The thin-walled copper tube has a low cost and can be adapted to samples of different diameters.

When the sample holder has a clamping nozzle, the static current direction is as follow: sample→clamping nozzle→pre-tightening screw→first pressing component→spring→screw rod→second pressing component→electrostatic lead-out component.

Method for Aligning Samples to the Rotating Shaft Axis

The fifth aspect of the present invention aims to provide a sample adjustment method capable of keeping the TBO sample area within the observation field of the TEM.

In order to keep the TBO sample area within the observation field of the TEM when the rotating shaft rotates, it is necessary to make the TBO sample area as close as possible to the rotating shaft axis of the rotating shaft.

The method of adjusting the TBO sample area to the rotating shaft axis of the rotating shaft includes the following steps:

S1. Making the above sample holder nozzle, clamping the sample in the sample holder nozzle, and then mounting the sample holder nozzle into the sample holder fixture;

S2. Inserting the sample holder with the sample into the TEM, finding one TBO sample area, and selecting a feature point of the TBO sample area based on the principle of easy identification of the feature point during the rotation;

S3. Rotating the rotating shaft to 0°, and recording the position where the feature point of the sample is projected on the electron microscope screen as D1; rotating the rotating shaft to 180° and recording the position where the feature point of the sample is projected on the electron microscope screen as D2;

S4. Driving the nanopositioner along the Y direction, and moving the position where the feature point of the sample is projected on the electron microscope screen to the central position Dz of D1 and D2;

S5. Rotating the rotating shaft to 90°, driving the nanopositioner along the Z direction, moving the position where the feature point of the sample is projected on the electron microscope screen to Dz;

S6. Rotating the rotating shaft to 0°, driving the nanopositioner along the Y direction, moving the position where the feature point of the sample is projected on the electron microscope screen to Dz;

S7. Repeating S5 and S6 until the position where the feature point of the sample is projected on the electron microscope screen remains unchanged at the horizontal position under the electron microscope when rotating back and forth;

S8. Increasing the magnification of the TEM and repeating S3 to S7, until the random movement caused by mechanical error is not negligible, indicating that the feature point of the sample is accurately positioned on the rotating shaft.

The movement back and forth may be coupled during the rotation. After each rotation, the piezoelectric rubbing mechanism needs to be driven to move the position where the feature point of the sample is projected on the electron microscope screen to the same X position along the X direction.

The overall diameter of the TEM sample holder is about 15 mm Considering that the O-ring groove for sealing needs to be mounted and enough structural stiffness is reserved, the spatial diameter of the rotating shaft is not more than 10 mm.

Self-Positioning of the Sample Holder Axis

The sixth aspect of the present invention aims to provide a sample holder that can automatically reset to the position that coincides with the central axis of the sampler holder after the sample rotates around the axis of the sample holder.

In order to realize the 360° rotation of the sample around the shaft, the sample holder is disposed to include a housing and a rotating shaft, the housing and the rotating shaft are coaxial. The rotating shaft is positioned in the inner chamber of the housing; the inner chamber is provided with a piezoelectric rubbing mechanism that rubs the rotation of the rotating shaft and a self-positioning mechanism; the self-positioning mechanism is provided with a symmetrical inclined plane, and the inclined plane is in contact with the rotating shaft. No matter how the rotating shaft rotates, due to the effect of the inclined plane, the central axis of the rotating shaft can always be automatically reset to the original position, thereby preventing the TBO sample area from being out of the TEM observation field caused by the shift of the center of the rotating shaft. Preferably, the rotating shaft is a ceramic shaft.

As a preferred embodiment, the self-positioning mechanism includes a supporting block, the supporting block is provided with a symmetrical inclined plane, and the inclined plane of the supporting block is in contact with the rotating shaft. Preferably, the inclined plane of the supporting block has a wear-resistant layer, and the wear-resistant layer is a part that is in contact with the rotating shaft. Preferably, a plurality of supporting blocks is distributed along the axial direction of the rotating shaft.

As a preferred embodiment, the self-positioning mechanism includes a pressing plate, the pressing plate has a flat plate, and a slope is symmetrically arranged on both sides of the flat plate. The rotating shaft is limited between the supporting block and the pressing plate, such that the rotating shaft does not move up and down or move on the left and right when rotating around the shaft. Preferably, each supporting block is corresponding to a pressing plate, with the supporting block at the bottom and the pressing plate at the top. Or, the self-positioning mechanism includes a plurality of supporting blocks and a pressing plate.

Preferably, the pressing plate is provided with a pair of mounting wings, and fixing holes are arranged on the mounting wings; the mounting wing is positioned at one end of the slope. A wear-resistant layer is provided on the inside of the flat plate, and the wear-resistant layer is the part that is in contact with the rotating shaft.

Preferably, a frame is provided between the housing and the rotating shaft, and the mounting wing is assembled to the frame through an elastic mounting assembly. The elastic mounting assembly is composed of a screw rod and a spring. The spring is sleeved on the shaft of the screw rod, and the spring is positioned between the mounting wing and the nut of the screw rod. The elastic mounting assembly enables the pressing plate to move slightly along the radial direction of the rotating shaft, which not only preloads the rotating shaft, but also allows the rotating shaft to rotate. The rotating shaft is limited between the pressing plate and the supporting block, and the pre-tightening force is adjusted by rotating the screw rod during assembly. After the assembly is completed, the spring will not continue to deform during use.

Rotating Shaft Drive Assembly

The seventh aspect of the present invention aims to provide a sample holder that can simultaneously drive the rotating shaft to rotate and move in the axial direction, or selectively drive the rotating shaft to rotate or move in the axial direction.

As a preferred embodiment, a frame is provided between the housing and the rotating shaft, and at least one set of rotating shaft drive assembly is arranged between the frame and the rotating shaft. Each set of rotating shaft drive assembly includes a drive unit, and the drive unit includes a substrate and a piezoelectric ceramic sheet. The substrate is an insulator, or the substrate is a printed circuit board.

An embodiment for driving the rotating shaft to move in the axial direction: the rotating shaft drive assembly includes an axial drive unit. The shear deformation direction of the piezoelectric ceramic sheet of the axial drive unit is consistent with the axial direction of the rotating shaft. The piezoelectric ceramic sheet is bonded to the substrate. A conductive coating is coated on the surface of both sides of the piezoelectric ceramic sheet. When driving, voltage signals are input between conductive coatings, for example, continuous or intermittent sawtooth waves are input, etc.

An embodiment for the rotation of the rotating shaft: the rotating shaft drive assembly includes a rotating drive unit.

The shear deformation direction of the piezoelectric ceramic sheet of the rotating drive unit is consistent with the circumferential direction of the rotating shaft. The piezoelectric ceramic sheet is bonded to the substrate, and a conductive coating is coated on the surface of both sides of the piezoelectric ceramic sheet. When driving, voltage signals are input between conductive coatings, for example, continuous or intermittent sawtooth waves are input, etc.

An embodiment of combination of rotation and axial movement of rotating shaft: the drive unit of the rotating shaft drive assembly includes a substrate, a first piezoelectric ceramic sheet and a second piezoelectric ceramic sheet; the deformation direction of the first piezoelectric ceramic sheet and the deformation direction of the second piezoelectric ceramic sheet are orthogonal, a conductive coating is coated on the surface of both sides of the first piezoelectric ceramic sheet and second piezoelectric ceramic sheet. When driving, voltage signals are input between conductive coatings, for example, continuous sawtooth waves are input, etc.

The deformation direction of the first piezoelectric ceramic sheet and the deformation direction of the second piezoelectric ceramic sheet are orthogonal, for example, the deformation direction of the first piezoelectric ceramic sheet is along the axis of the rotating shaft (forward and backward direction), which is used to drive the rotating shaft to translate forward and backward. The deformation direction of the second piezoelectric ceramic sheet is along the circumferential direction of the rotating shaft (the direction of rotation), which is used to rub the rotating shaft to rotate.

Preferably, the first piezoelectric ceramic sheet is stacked on the second piezoelectric ceramic sheet, or the second piezoelectric ceramic sheet is stacked on the first piezoelectric ceramic sheet; the first piezoelectric ceramic sheet and the second piezoelectric ceramic sheet are fixed by bonding. Preferably, the drive unit is provided with a wear-resistant layer. The wear-resistant layer is in direct contact with the rotating shaft, reducing wear and extending the service life of the drive unit.

Preferably, the surface of the first piezoelectric ceramic sheet on one side is connected to the surface of the second piezoelectric ceramic sheet on one side, sharing a wire.

Preferably, three or five groups of rotating shaft drive assemblies are arranged along the axis of the rotating shaft. Preferably, five sets of rotating shaft drive assemblies are arranged, two sets of rotating shaft drive assemblies are arranged symmetrically at the front and rear of the rotating shaft, and one set of rotating shaft drive assemblies are arranged at the middle position. The two groups of rotating shaft drive assemblies make limited forces for the rotation and axial movement of the rotating shaft, and multiple groups of rotating shaft drive assemblies are arranged to apply forces in the same direction to the rotating shaft, which facilitates the rotation and axial movement of the rotating shaft.

Frame

The eighth aspect of the present invention is to provide a sample holder capable of accommodating a rotating shaft drive assembly and a rotating shaft.

The frame is provided between the housing and the rotating shaft, and the frame is coaxial with the housing and rotating shaft. The frame, as a transitional component between the rotating shaft and the housing, make the rotating shaft and the frame to be coaxial, and then the rotating shaft-frame is mounted into the housing to make the rotating shaft, the frame and the housing to be coaxial to improve the mounting accuracy. In addition, the frame further provides mounting positions for the rotating shaft drive assembly, and the frame further functions to separate the rotating shaft from the wire and prevent the wire from interfering with the motion of the rotating shaft.

As a preferred embodiment, the frame is provided with a matching portion that is in clearance fit with the inner wall of the housing, a receiving groove for accommodating a rotating shaft, and a mounting portion for carrying accessories. The receiving groove is provided with a symmetrical inclined plane, the mounting portion is fixedly provided with a printed circuit board, and the printed circuit board is provided with connecting wire.

Preferably, the supporting block is fixed to the receiving groove, and the receiving groove is arranged in multiple sections along the frame axis; a mounting chamber for accommodating a rotating shaft drive assembly is arranged on the frame, and the receiving groove and the mounting chamber are spaced apart. After the rotating shaft drive assembly is mounted in place, the wear-resistant layer of the rotating shaft drive assembly forms an inclined plane that limits the rotating shaft.

Preferably, each drive unit has a connecting circuit board for current flow, the connecting circuit board is a printed circuit board, and the connecting circuit board is provided with a circuit electrically connected to the rotating drive assembly; each rotating shaft drive assembly is corresponding to an adapter circuit board, the adapter circuit board is a printed circuit board, and the adapter circuit board is provided with a connecting circuit; the current of the connecting circuit board is collected in the adapter circuit board, the adapter circuit board is connected to the transmission wire, and the transmission wire is connected to the signal connector on the sample holder. The signal connector is connected to an external signal source, and the drive unit outputs control signals. The circuit board is adopted to realize the transmission of electrical signals to avoid interference with the rotation of the rotating shaft by a wire.

Preferably, the adapter circuit board is fixed to the frame, and the rotating shaft is positioned below the adapter circuit board. Preferably, the adapter circuit board is positioned between the pressing plate and the rotating shaft drive assembly. The adapter circuit board is a printed circuit board. The area of the drive unit that can be welded is limited and the welding is not strong. The adapter circuit board is used to reduce the contact with the wire on the drive unit during the assembly process to protect the solder joints.

Preferably, the connecting circuit board and the adapter circuit board are electrically connected by a wire.

Preferably, the frame is cylindrical, a groove is cut on one side of the frame, the groove runs through the axis of the frame, and the receiving groove and the mounting chamber are both positioned on the groove; a notch is provided at the position where the connecting circuit board is placed using an arc surface of the frame as a bottom and an opening of the groove as a top, and the notch is formed by cutting part of the frame wall from the top to the bottom. The walls at both ends of the notch play a role in positioning the connecting circuit board.

Preferably, the width of each connecting circuit board is less than or equal to the wall thickness of the frame, and the connecting circuit board is fixed to the top surface of the notch with a screw.

Preferably, the plane of the frame wall where the adapter circuit board is arranged is higher than the plane of the frame wall where the connecting circuit board is arranged. Thus, the adapter circuit board is partially suspended and mounted alternately with the connecting circuit board thereunder, saving the mounting space; in addition, a gap is provided between the adapter circuit board and the connecting circuit board, to avoid short circuit in wires.

Preferably, the frame is provided with a mounting threaded hole, and the threaded hole penetrate through the frame from top to bottom. The threaded holes are all through holes, which facilitate to clean the frame, keep the sample holder clean, and avoid contamination and interference with the sample chamber in the TEM.

Connection to Optical Fiber

The ninth aspect of the present invention aims to provide a sample holder capable of connecting an optical fiber into the sample holder, such that the changing process of the sample can be photographed in situ under a TEM.

Optical fiber is connected to the sample holder. The functions of the optical fiber: 1) to adjust the light source to a specific spectrum of light, introduce the light into the electron microscope, irradiate the sample, and apply electromagnetic field; 2) to collect the light emitted/reflected from the sample, and transmit the light to the electron microscope for measurement and analysis, for example, measuring the black-body radiation emitted by the sample to measure the sample temperature.

As a preferred embodiment, the optical fiber groove is provided on the side of the frame, and the optical fiber groove penetrates through the frame axially. An optical fiber groove is provided on the side of the frame for optical fiber to pass through, which can avoid the wear of optical fiber.

As a preferred embodiment, the head portion of the sample holder has a front-end circuit board, the front-end circuit board is a printed circuit board, the front-end circuit board is engaged with the optical fiber groove, and the front-end circuit board and the optical fiber groove are positioned in the same straight line. The optical fiber groove is provided on the side of the frame, because the head portion of the sample holder has a front-end circuit board, the optical fiber groove is engaged with the front-end circuit board, and the front-end circuit board has the function of guiding the optical fiber, and the head portion of the optical fiber passes through the front-end circuit board, the head portion of optical fiber has a small bending amplitude. If the head portion of the optical fiber has large bending amplitude, it will cause optical signal attenuation and even break the optical fiber. When the optical signal is attenuated, the signal-to-noise ratio of the signal drops, or is lower than the measuring range of the instrument and cannot be measured.

Preferably, the front-end circuit board is mounted on the frame through mounting blocks. Preferably, the mounting block fixes the front-end circuit board to the frame by bolts. The front-end circuit board has a guiding plane for guiding the optical fiber, and the guiding plane is flush with the optical fiber groove. The guiding plane extends in the direction of the sample holder nozzle, and the optical fiber approaches the sample along the guiding plane.

Preferably, two optical fibers are provided symmetrically on the frame. Correspondingly, the front-end circuit board has a symmetrical guiding plane, which is engaged with the optical fiber groove one by one. Two optical fiber grooves are provided. The optical fiber can pass through any one of the optical fiber grooves, or two optical fibers can be used to pass through the two optical fiber grooves respectively. For example, introducing different light spectra; or one optical fiber emits light and the other collects light.

Preferably, the optical fiber groove and the connecting circuit board are positioned on the same straight line. That is, the connecting circuit board is arranged along the route where the optical fiber groove is positioned, and the lead wire of the connecting circuit board can be led out from the inner wall of the frame or through the optical fiber groove. In this way, the arrangement of the wire and the rotation of the rotating shaft do not interfere with each other.

Preferably, the optical fiber groove is linear and can accommodate at least an optical fiber with a diameter of 0.5 mm Lead-Out of Wires The tenth aspect of the present invention is to provide a sample holder that can stably input the signal outside the sample holder into the sample holder, thereby controlling the precise motion of the nano-actuator, and at the same time, can stably output the static electricity in the TEM sample compartment and the information collected by the sample holder, and the connection between the wires is reliable, and the sample holder will not interfere with the rotation of the rotating shaft and will not be interfered by the rotating shaft.

The wire connecting the front-end circuit board needs to be connected to the external control box. The wire passes from the outside of the frame, and the long-term contact friction not only causes wear to the wire, but also the wires are easy to entangle with each other due to small wire diameter and complex wires. At the bottom of the frame, a wiring groove is provided for wires to pass through, which can avoid the abrasion and entanglement of the wires.

As a preferred embodiment, the bottom of the frame is provided with a wiring groove, and the wiring groove penetrates through the frame axially. The wiring groove is a groove that is open to the bottom.

As a preferred embodiment, the wires of the front-end circuit board pass through the wiring groove.

Arrangement of Piezoelectric Ceramic Sheet and Electrodes

The piezoelectric ceramic sheet used to drive the rotating shaft to translate or rotate is a piezoelectric ceramic shear sheet that undergoes shear deformation under the action of an external electric field along the thickness direction.

Preferably, the conductive coatings are uniformly coated on the surfaces on both sides of the piezoelectric ceramic sheet, which are the upper-layer electrode and the lower-layer electrode.

As a preferred embodiment, the drive unit is provided with a substrate, a piezoelectric ceramic sheet and a wear-resistant sheet. The substrate has a ceramic sheet area and an electrode area. The piezoelectric ceramic sheet is stacked and bonded to the ceramic sheet area. The electrode area is provided with multiple circuits, and the multiple circuits are electrically connected to the conductive coating on the surface of the piezoelectric ceramic sheet.

Preferably, the ceramic sheet area is provided with one piezoelectric ceramic sheet, or stacked with at least two piezoelectric ceramic sheets.

Preferably, when there are at least two piezoelectric ceramic sheets, the telescopic direction of the piezoelectric ceramic sheets is different from each other.

Preferably, the substrate is a printed circuit board.

Preferably, the substrate is a metal-based printed circuit board.

Preferably, the substrate is an aluminum-based printed circuit board. Preferably, the substrate is provided with a recess and a pair of mounting holes, the mounting holes are used as the front and rear ends of the substrate, the ceramic sheet area and the electrode area are positioned in the center of the substrate, the recess is positioned at the front and rear ends of the substrate and around the mounting holes; the ceramic sheet area and the electrode area are positioned on the left and right sides of the substrate.

Preferably, the lower-layer electrode of the lowermost piezoelectric ceramic sheet is in direct contact with the ceramic sheet area on the substrate, and is connected to the electrode area on the substrate through the circuit on the ceramic sheet area; the upper-layer electrode surface of the uppermost piezoelectric ceramic sheet is provided with an area A and an area B; the wear-resistant sheet is pasted to the area A; the area B is electrically connected to an adapter cable; one end of the adapter cable is electrically connected to the electrode area on the substrate.

Preferably, the adapter cable is soldered to the area B; or, the adapter cable is bonded to area B with a conductive adhesive.

Preferably, when there is a plurality of piezoelectric ceramic sheets, the upper-layer electrode of each layer of piezoelectric ceramic sheet other than the uppermost piezoelectric ceramic sheet has an overlapping area and an exposed area; the overlapping area is electrically connected to the lower-layer electrode of the upper layer of piezoelectric ceramic sheet of this layer of piezoelectric ceramic sheet; the exposed area is electrically connected to an adapter cable; one end of the adapter cable is electrically connected to the electrode area on the substrate.

Preferably, the adapter cable is soldered to the exposed area; or, the adapter cable is bonded to the exposed area with a conductive adhesive.

Preferably, the adapter cable is soldered to the electrode area on the substrate.

Preferably, the overlapping area is in direct contact with the lower-layer electrode of the upper layer of piezoelectric ceramic sheet of this layer of piezoelectric ceramic sheet.

Preferably, the lower-layer electrode is grounded. Since the upper-layer electrode and lower-layer electrode of each piezoelectric ceramic sheet can be equivalent to capacitive loads, and the voltage required to drive each piezoelectric ceramic sheet is relatively high, when the lowermost piezoelectric ceramic sheet is driven by a high-frequency signal, the voltage signal is prone to leak to the frame, which may damage the electron microscope. Therefore, keeping the lower-layer electrode of the lowermost piezoelectric ceramic sheet grounded can reduce the voltage leaking to the frame.

Or, in another arrangement of piezoelectric ceramic sheets and electrodes, the drive unit includes an electrode plate and a piezoelectric ceramic sheet, and the piezoelectric ceramic sheet is fixed by bonding on the surface of the electrode plate. The electrode plate is a conductor, and the electrode plate is electrically connected to the lead wire.

As a preferred embodiment, the drive unit includes a first electrode plate, a first piezoelectric ceramic sheet and a second electrode plate. The first piezoelectric ceramic sheet is deformed by axial shear along the rotating shaft, or the first piezoelectric ceramic sheet is deformed by cyclic shear along the rotating shaft; the first piezoelectric ceramic sheet is positioned between the first electrode plate and the second electrode plate, and the first electrode plate and the second electrode plate have their respective lead ends.

Preferably, the drive unit comprises a first electrode plate, a first piezoelectric ceramic sheet, a second electrode plate, a second piezoelectric ceramic sheet and a third electrode plate; the sequence of mounting is the first electrode plate, the first piezoelectric ceramic sheet, the second electrode plate, the second piezoelectric ceramic sheet, and the third electrode plate successively; the shear deformation direction of the first piezoelectric ceramic sheet is different from the shear deformation direction of the second piezoelectric ceramic sheet; the third electrode plate is close to the rotating shaft but not in contact with the rotating shaft.

Preferably, the first electrode plate is fixed by bonding on the insulating layer, the insulating layer is fixed by bonding on the frame or the housing, and the third electrode plate is provided with a wear-resistant layer that is in contact with the rotating shaft. The "first", "second", and "third" are just to illustrate that there are three electrode plates; the "first" and "second" are just to illustrate that there are two piezoelectric ceramic sheets.

Preferably, the first electrode plate is grounded. Since the first electrode plate, insulating layer, and frame can be equivalent to capacitive loads in the circuit, and the voltage required to drive each piezoelectric ceramic sheet is relatively high, the voltage signal is prone to leak to the frame when each piezoelectric ceramic sheet is driven by a high-frequency signal, which may damage the electron microscope. Therefore, keeping the first electrode plate grounded can reduce the voltage leaking to the frame. Driving the second electrode plate and the third electrode plate with an appropriate voltage signal can also obtain the required electric field without affecting the realization of the driving function.

Position Information of Rotating Shaft

The eleventh aspect of the present invention aims to provide a sample holder that can obtain the rotation angle of the rotating shaft in real time and facilitate the mounting of the magnetic field sensor.

A magnet is provided at the end of the rotating shaft, the frame is provided with a lead-out circuit board. The magnetic field changes when the magnet rotates and moves back and forth. The magnetic field sensor measures the magnetic field, and the position information of the rotating shaft can be obtained through the magnetic field, that is, the rotation angle and the motion distance of the rotating shaft. Because the projection angle is required for 3D reconstruction, the rotation angle of the rotating shaft needs to be measured. The purpose of measuring the motion distance of the rotating shaft is to locate the sample at the position when the magnetic field sensor is calibrated, such that the error in measuring the angle of rotation of the rotating shaft is smaller. The current sample holder is driven by three degrees of freedom, while this sample holder is driven by four degrees of freedom, which adds the axial rotation of the rotating shaft. By measuring the rotation angle of the rotating shaft, it provides a projection angle for three-dimensional reconstruction.

A magnet is provided at the end of the rotating shaft, the frame is provided with a lead-out circuit board, and the frame is opened with a notch, the lead-out circuit board includes a bending portion, and the bending portion is positioned in the notch, the magnetic field sensor is fixed on the bending portion. The magnetic field sensor is placed in the notch to reduce the occupied space, thereby reducing the diameter of the housing of the suit frame. The space of the notch is much larger than the space required for accommodating the magnetic field sensor, providing enough space for disassembly and maintenance of the magnetic field sensor.

As a preferred embodiment, the lead-out circuit board includes a plane portion, the plane portion and the bending portion are bent to cover the frame, and the plane portion is connected with the bending portion by a wire, and the magnetic field sensor is connected with the bending portion through solder. The lead-out circuit board is a printed circuit board. The solder connection between the magnetic field sensor and the lead-out circuit board can not only fix the magnetic field sensor, but also short-circuit one pair of pins on the lead-out circuit board, reducing the number of wires that need to be connected.

As a preferred embodiment, the plane portion and the bending portion are in an "L" shape, and the magnetic field sensor is opposite to the magnet. A bending circuit board is used, which occupies a small area and is easy to disassemble. If the circuit board is not bent, there is not enough space to place the screws, and it needs to be glued and fixed, which is difficult to disassemble and repair.

Preferably, the lead-out circuit board has two groups of lead-out terminals, one group of lead-out terminals is electrically connected to the wire of the drive unit, and the other group of lead-out terminals is connected to the electric connector of the sample holder.

Method for In-Situ Dynamic 3D Reconstruction of Samples Using a Multi-Degree-of-Freedom Sample Holder The twelfth aspect of the present invention aims to use the aforesaid sample holder to reconstruct in situ the three-dimensional reconstruction method of the actual sample morphological changes in the sample compartment of the TEM.

The method of performing in-situ dynamic 3D reconstruction of a sample using a multi-degree-of-freedom sample holder includes the following steps:

S1. Making the above sample holder nozzle, putting the sample into the head end of the sample holder, and inserting the sample holder into the TEM;

S2. Adjusting a feature point on the TBO sample area to align with the sample holder axis;

S3. Making the rotating shaft to rotate 180° cumulatively, and taking a photo every 1°;

S4. Importing the photos obtained in step S3 into a computer for three-dimensional reconstruction.

The Present Invention has the Following Advantages:

The Advantages of the Present Invention are:

1. By disposing a pre-tightening screw, an electrical path and an electrostatic lead-out component on the nanopositioner, the static electricity on the TBO sample area is transmitted to the pre-tightening screw through the sample, and the pre-tightening screw reaches the electrostatic lead-out component through the electrical path on the nano-actuator, the current on the electrostatic lead-out component is drawn out through the wire to avoid the electrostatic field generated on the TBO sample area when the electron beam is irradiated to the sample, which will affect the electron beam imaging.

2. Since the observation scale of TEM is usually micron or nanometer. When observing the TBO sample area, it is likely that the TBO sample area is beyond the observation field of the TEM after the nano-actuator rotates the sample. In order to be able to observe samples of various sizes, a sample holder nozzle is arranged to mount the sample, and the sample and sample holder nozzle are mounted as sample components into the front end of the sample holder.

3. In order to realize the 360° rotation of the sample around the shaft, the sample holder is disposed to include a housing and a rotating shaft, the housing and the rotating shaft are coaxial. The rotating shaft is positioned in the inner chamber of the housing; the inner chamber is provided with a piezoelectric rubbing mechanism that rubs the rotation of the rotating shaft and a self-positioning mechanism; the self-positioning mechanism is provided with a symmetrical inclined plane, and the inclined plane is in contact with the rotating shaft. No matter how the rotating shaft rotates, due to the effect of the inclined plane, the central axis of the rotating shaft can always be automatically reset to the original position, thereby preventing the TBO sample area from being out of the TEM observation field caused by the shift of the center of the rotating shaft.

4. The sample holder is provided with a frame. The frame is provided between the housing and the rotating shaft, and the frame is coaxial with the housing and rotating shaft. The frame, as a transitional component between the rotating shaft and the housing, make the rotating shaft and the frame to be coaxial, and then the rotating shaft-frame is mounted into the housing to make the rotating shaft, the frame and the housing to be coaxial to improve the mounting accuracy. In addition, the frame further provides mounting positions for the rotating shaft drive assembly, and the frame further functions to separate the rotating shaft from the wire and prevent the wire from interfering with the motion of the rotating shaft.

5. Optical fiber is connected to the sample holder. The functions of the optical fiber is as follows: firstly, to adjust the light source to a specific spectrum of light, introduce the light into the electron microscope, irradiate the sample, and apply electromagnetic field; secondly, to collect the light emitted/reflected from the sample, and transmit the light to the electron microscope for measurement and analysis. An optical fiber groove is provided on the side of the frame for optical fiber to pass through, the front-end circuit board is engaged with the optical fiber groove to avoid the wear of the optical fiber. The optical fiberhead portion is led out by the front-end circuit board, and the head portion of the optical fiber has smaller bending amplitude.

6. The sample holder is provided with a rotating shaft drive assembly. The rotating shaft drive assembly can make the rotating shaft to move and rotate in the axial direction, satisfying the multi-dimensional observation of the sample.

7. The sample holder can detect the position information of the rotating shaft. The solder connection between the magnetic field sensor and the lead-out circuit board can not only fix the magnetic field sensor, but also short-circuit one pair of pins on the lead-out circuit board, reducing the number of wires that need to be connected; the lead-out circuit board includes a plane portion and a bending portion, the plane portion and the bending portion are laid vertically on the surface of the frame, the magnetic field sensor is fixed on the bending portion. The bending circuit board is used, which occupies a small area and is easy to disassemble.

8. The elastic connecting component is used to provide the pre-tightening force between the pressing component and the joint ball, such that there is adjustable and stable static and dynamic friction between the pressing component and the joint ball. The static friction is used to support the sample, the sample holder, and the pressing component, to reduce the influence of gravity on the motion of sample and enhance the accuracy of displacement control; the nanopositioner contains fewer parts, and the connection relationship is simple and clear, which is easy to produce, and easy to adjust and calibrate; the slot matches with the joint ball, and the position between the pressing component and the joint ball is stable, the connection relationship between the pressing components is stable to prevent the nanopositioner from falling off.

BRIEF DESCRIPTION OF THE DRAWINGS

FIG. 23 is a performance comparison list of the present invention and existing sample holders.

DETAILED DESCRIPTION

Figure 1:
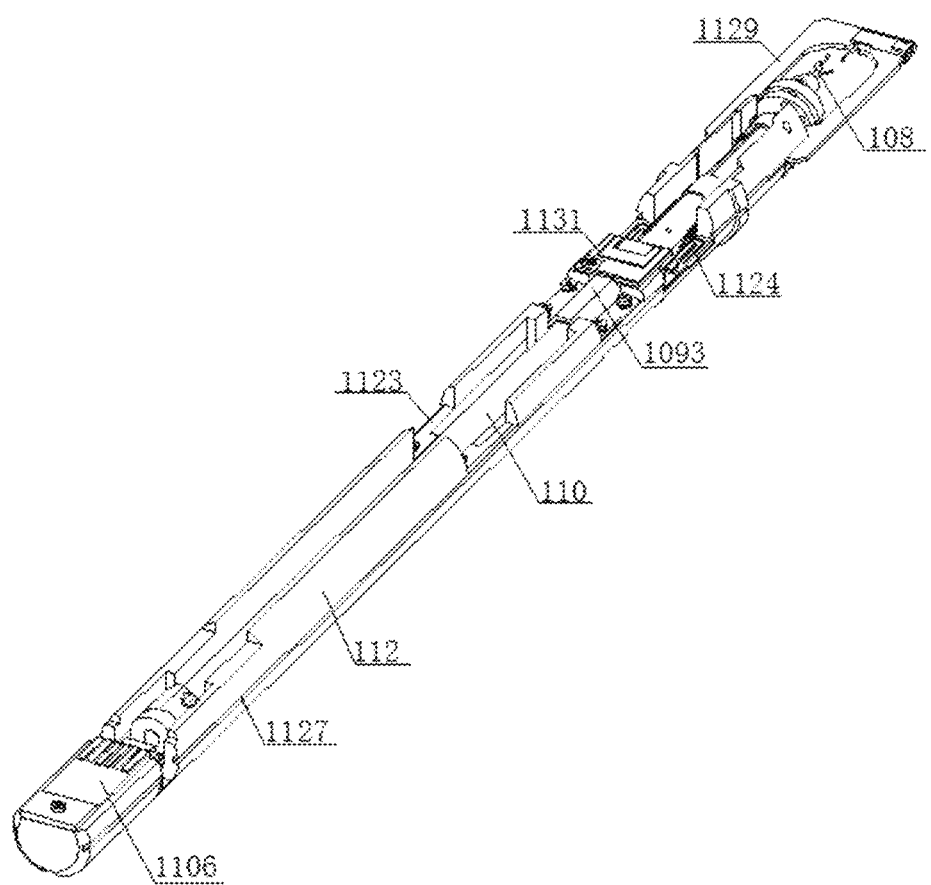
FIG. 1 is a schematic diagram of a sample holder.
Figure 2:
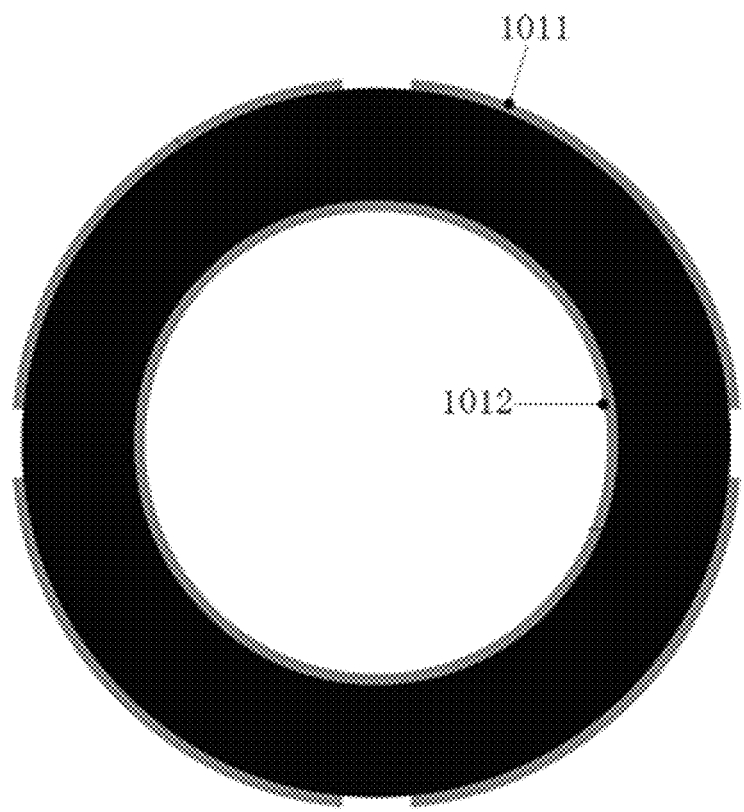
FIG. 2 is a schematic diagram of a piezoelectric ceramic tube.

FIG. 1 shows a multi-degree-of-freedom sample holder. As shown in FIG. 2, the sample holder is provided with a nanopositioner, the nanopositioner includes a driving member 101, a joint ball 103, and a pressing component assembly. The joint ball 103 is fixed to the driving member 101. The pressing component assembly includes at least two pressing components 105 and an elastic connecting component 104. The elastic connecting component 104 connects adjacent pressing components, the pressing component grips the joint ball 103, and there is a pre-tightening force between the pressing component and the joint ball 103. For example, a piezoelectric ceramic tube is used as a driving member 101.

Pressing Component

In some embodiments, as shown in FIG. 2, each pressing component has a recessed portion 1051 and a connecting portion 1052, respectively, the elastic connecting component 104 is arranged between the connecting portions 1052 of adjacent pressing components, and the recessed portion 1051 of all the pressing components form a slot that mates with the joint ball 103. The slot and the joint ball 103 are in line contact or surface contact or point contact; the elastic connecting component 104 makes a pre-tightening force between the pressing component and the joint ball 103, when the joint ball 103 is stationary or the driving member 101 is moving slowly with the joint ball 103, the static friction between the joint ball 103 and the pressing component 105 makes the pressing component 105 stationary relative to the joint ball 103. When the driving member 101 quickly resets with the joint ball 103, a sliding friction is generated between the joint ball 103 and the pressing component 105. When the joint ball 103 is reset, the pressing component 105 remains in the original place and does not reset with the joint ball 103, or although a reset motion is generated with the joint ball 103, the motion displacement is smaller than the reset displacement of the joint ball.

The slot is hemispherical, or V-shaped, or conical.

The pressing component 105 is an integrated board, and the recessed portion 1051 is positioned in the center of the board.

The pressing component 105 is positioned outside the joint ball 103. When the sample holder is placed upright, the nanopositioner faces upwards, and when the sample holder is placed upright on both sides, the left and right sides, front and back sides are the outer sides. Preferably, a sample holding portion is provided on the pressing component 105. When all the pressing components are assembled in place, the sample holding portion is combined into a sample fixture, and the sample fixture is used to mount the sample. When mounting, the pressing component 105 is used to grip the joint ball 103 from both sides of the joint ball 103, and the elastic connecting component 104 provides the pre-tightening force between the pressing component 105 and the joint ball 103.

As shown in FIGS. 2-5, in some embodiments, a pressing component includes a first pressing component 1053 and a second pressing component 1054, and a plurality of mounting positions are evenly distributed around the recessed portion 1051 of the first pressing component 1053 and the recessed portion 1051 of the second pressing component 1054, and each mounting position is corresponding to an elastic connecting component 104, and the mounting position of the first pressing component 1053 is aligned with the mounting position of the second pressing component 1054. Thus, one end of the elastic connecting component 104 is mounted in the mounting position of the first pressing component 1053, and the other end is mounted in the mounting position of the second pressing component 1054. The first pressing component 1053 is on the top, the second pressing component 1054 is on the bottom, and the slot of the second pressing component 1054 is a through hole. The inner wall of the through hole is hemispherical, V-shaped, or conical. The first pressing component 1053 is provided with a sample fixture.

Or, the first pressing component 1053 and the second pressing component 1054 are positioned on both sides of the joint ball 103 respectively.

The recessed portion 1051 of the first pressing component 1053 has a wear-resistant layer on the surface. The recessed portion 1051 of the second pressing component 1054 has a wear-resistant layer 113 on the surface. The wear-resistant layer facilitates to maintain the stability of friction. The joint ball 103 has a wear-resistant layer on the surface, or the joint ball 103 is made of wear-resistant materials. For example, the joint ball is made of aluminum or aluminum alloy, and anodized the surface of the recessed portion and/or the surface of the joint ball.

When the driving member swings on the left side (or right side, front side, back side), the friction force causes the nanopositioner to move to the side, and then moves the sample to the side. The motion distance of the sample is proportional to the value of the opposite constant voltage applied to the two conductive coatings. The position of the sample is observed repeatedly and the voltage value is adjusted accordingly to move the sample to the desired position.

Elastic Connecting Component

As shown in FIGS. 2 to 5, in some embodiments, the elastic connecting component 104 is an elastic column made of spring or elastic material (such as a silica gel column, a rubber column, etc.). One end of the elastic connecting component 104 is fixed with the first pressing component 1053, and the other end is fixed with the second pressing component 1054. After the two pressing components grip the joint ball 103, the elastic connecting component 104 is in a deformed state, and the restoring force of the elastic connecting component 104 provides the pre-tightening force between the two pressing components and the joint ball 103.

Or, the elastic connecting component is composed of a screw rod 1041 and a spring 1042. The spring 1042 is sleeved on screw rod 1041. The spring 1042 is positioned between the screw rod 1041 and the first pressing component 1053. The mounting position of second pressing component 1054 is the screw hole that engages with screw rod 1041. After the screw rod 1041 is engaged with the mounting position of the second pressing component 1054, the spring 1042 is in a compressed state, and the spring 1042 pushes the first pressing component 1053 to the second pressing component 1054, and the spring 1042 provides a pre-tightening force between the first pressing component 1053, the second pressing component 1054 and the joint ball 103. The mounting position of the first pressing component 1053 is a through hole, and the through hole is in clearance fit with screw rod 1041. There is no friction between the through hole and the screw rod 1041, which facilitates the spring 42 to push the first pressing component 1053.

In some embodiments, the screw rod 1041 extends out of the mounting hole 1043 of the second pressing component 1054, or a fixing portion is provided between the screw rod 1041 and the second pressing component 1054; or the screw rod 1041 passes through the first pressing component 1053 and the second pressing component 1054 successively to engage with the nut. For example, after the second pressing component 1054 is mounted in place, the screw rod 1041 and the second pressing component 1054 are fixed by welding or fixed by bonding, etc., or the threads on the screw rod are damaged. When the joint ball 103 cyclically moves to drive the displacement of the first pressing component 1053 and the second pressing component 1054, the shaking of the first pressing component 1053 and the second pressing component 1054 will cause vibration between the screw rod 1041 and the second pressing component 1054, causing the screw rod 1041 to loosen or even detach from the second pressing component 1054; the loosening of the screw rod 1041 will affect the precise control of the position; When the screw rod 1041 detached from the second pressing component 1054, it will cause the first pressing component 1053 and the sample to fall and damage the electron microscope. The purpose of fixing the screw rod and the second pressing component, or setting a nut, and reserving a redundant thread is to cushion or resist the impact of the nanopositioner swinging, to prevent the screw rod from detaching from the second pressing component 1054 and causing the nanopositioner and the sample to fall off, and to keep a stable connection between the pressing component and the joint ball 103.

The screw rod 1041 and spring 1042 are used to adjust the pre-tightening force between the pressing component and the joint ball 103 according to the degree of tightening of the screw rod 1041, reducing the design and manufacturing requirements for elasticity itself. The elastic connecting component 104 provides continuous and stable pressure between the pressing component and the joint ball 103, such that there is a stable friction force between the pressing component and the joint ball 103.

Driving Member

Figure 6:
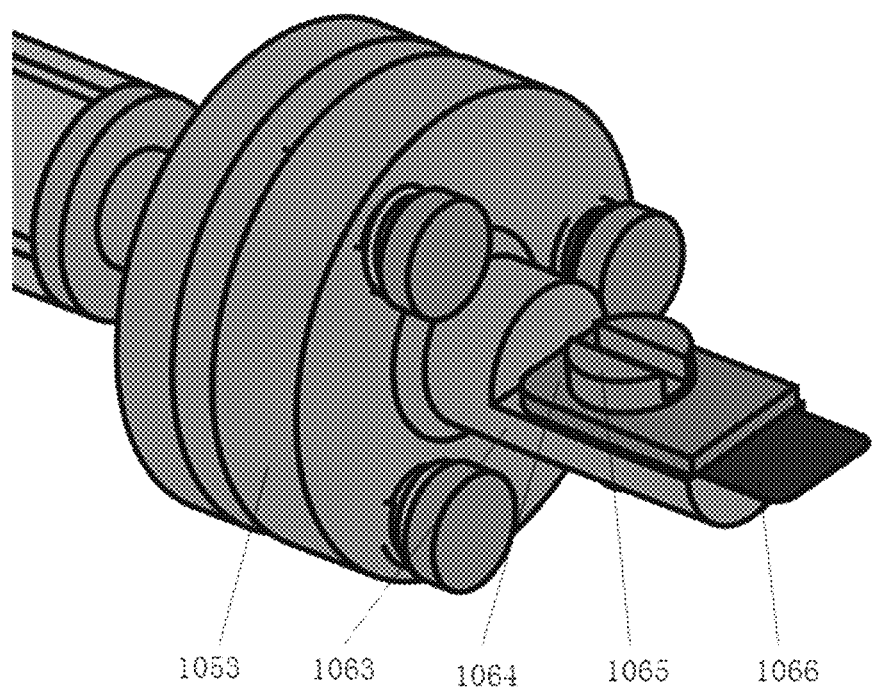
FIG. 6 is a schematic diagram of a third sample fixture.

As shown in FIG. 2, in some embodiments, the driving member 101 is a piezoelectric ceramic tube. The piezoelectric ceramic tube is a hollow tube. One end of the piezoelectric ceramic tube is fixed with the joint ball 103, and the other end is mounted on the sample holder; the piezoelectric ceramic tube has an inner surface and an outer surface, and a plurality of conductive area groups are provided on one surface of the piezoelectric ceramic tube, as shown in FIG. 6, each conductive area group includes two symmetrical conductive areas 1011, all conductive areas 1011 are independent of each other, and each conductive area 1011 has a conducive wire; the other surface of the piezoelectric ceramic tube is the whole area conductive portion 1012. The whole area conductive portion 1012 means that the conductive coating completely covers another surface.

As shown in FIG. 2, the conductive area group is arranged on the outer surface of the piezoelectric ceramic tube, and the whole area conductive portion 1012 is arranged on the inner surface of the piezoelectric ceramic tube. Alternatively, the conductive area 1011 group is arranged on the inner surface of the piezoelectric ceramic tube, and the whole area conductive portion 1012 is arranged on the outer surface of the piezoelectric ceramic tube. For example, when the conductive area group is evenly distributed along the outer (inner) surface of the piezoelectric ceramic tube, and the whole area conductive portion 1012 covers the inner (outer) surface. An insulating coating is provided between adjacent conductive areas 1011. The voltage directions of two conductive areas 1011 of each conductive area group are opposite.

Figure 3:
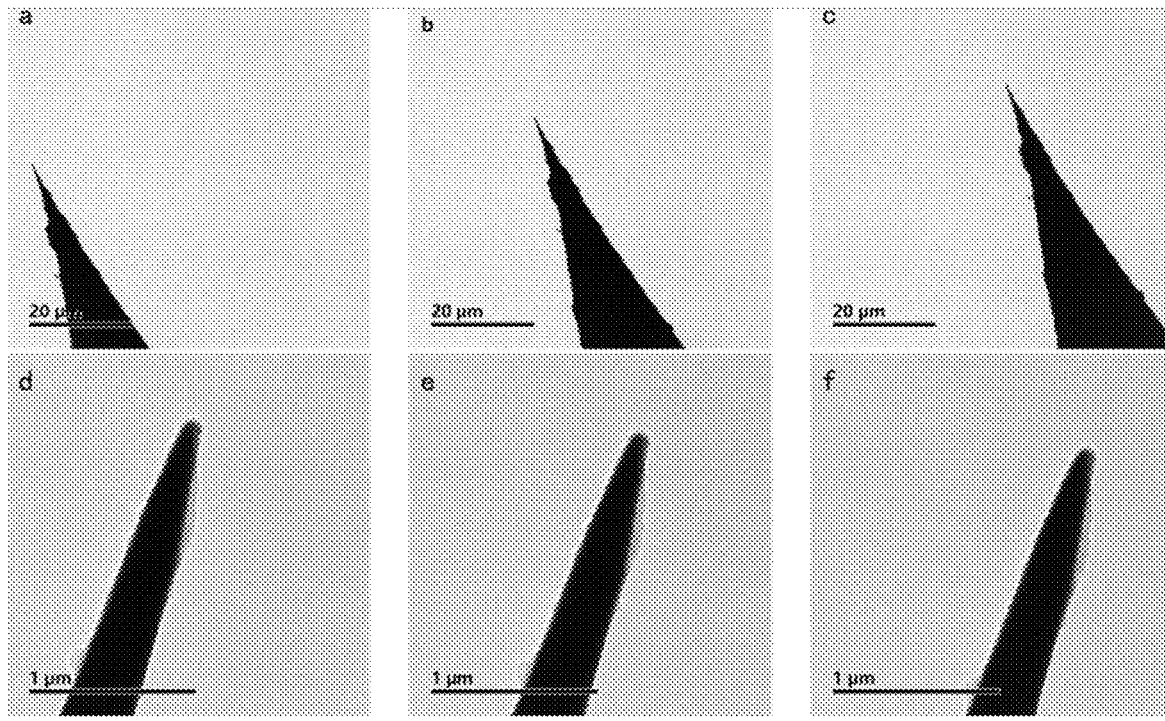
FIG. 3 is a rendering of the TBO sample area observed under the TEM of the present invention, where a, b, c show a single-step large-step motion driven by a larger sawtooth peak-peak, and d, e, f show a single-step small-step motion driven by a smaller sawtooth peak-peak.

In some embodiments, as shown in FIG. 3, the joint ball 103 is connected to the piezoelectric ceramic tube through a ball seat 102. The ball seat 102 includes a connecting rod fixed to the joint ball 103 and a connecting base fixed to the piezoelectric ceramic tube. The diameter of the connecting rod is smaller than the diameter of the joint ball 103. The connecting rod and the connecting base are detachably fastened and connected, for example, a threaded connection, a key connection, etc. When mounting, the connecting rod passes through the slot through hole of the second pressing component, the slot of the second pressing component is in contact with the joint ball, and then the connecting rod is fixed with the connecting base. As a result, the disassembly and replacement of the second pressing component are convenient.

The bottom end of the piezoelectric ceramic tube is fixed, and soldered to the conductive coating on the inner side of the piezoelectric ceramic tube using a wire, and kept grounded. Four wires are welded to the four conductive coatings on the outer side of the piezoelectric ceramic tube respectively, and the other end is connected to each output terminal of the voltage amplifier, then each input terminal of the voltage amplifier is connected to a function signal generator. The two degrees of freedom of the sample holder can be driven separately. The method of driving the sample holder to any degree of freedom and moving the sample to the required position in this degree of freedom is to apply positive and negative sawtooth waves to two symmetrical conductive coatings on the outer surface of the piezoelectric ceramic tube through a wire. The sawtooth wave can be continuous or pulsed, as shown in FIG. 3. The more conductive area 1011 is, the more possible motion directions of the joint ball 103 are.

As shown in FIG. 3, for a continuous sawtooth wave, the preferable parameters are peak-to-peak 100V, frequency below 100 Hz, and slew rate above 100V/μs. Properly reducing the peak-to-peak value can reduce the motion step length, but too low peak-to-peak value (in some cases, less than 40V) will cause the motion step length to drop to zero sharply, which may be related to the microstructure of the friction surface. When the peak-to-peak value is higher than 100V, the piezoelectric ceramic will be broken down and the piezoelectric ceramic tube will be destroyed. When the frequency is higher than 100 HZ, the eigenvibration of the piezoelectric ceramic tube or the overall device structure will be excited, such that the motion of the joint ball 103 is no longer a "slow and fast" motion in the plane. The driving principle of the nanopositioner cannot be satisfied, and the sample cannot move. Reducing the frequency can reduce the number of movement steps per unit time and control the movement speed of the sample. When the slew rate is lower than 100V/μs, the acceleration of the joint ball 103 in the sliding phase will be too small, and the friction can keep the moving parts to move with the joint ball 103 without slipping, and the sample cannot generate a long-displacement motion by accumulating the steps.

The position of the sample is observed through other observation equipment (such as optical microscope, electron microscope, etc.). When the sample moves to the vicinity of the target position, an opposite constant voltage is applied to the aforesaid symmetric conductive area to make one side of the piezoelectric ceramic tube to elongate, and the other side to shorten, with overall bending, such that the joint ball 103 fixed on one end of the piezoelectric ceramic tube moves to one side.

In some embodiments, the connecting rod and the connecting base are detachably fastened and connected, for example, a threaded connection, a key connection, etc. As a result, the disassembly and replacement of the first pressing component are convenient.

Figure 4:
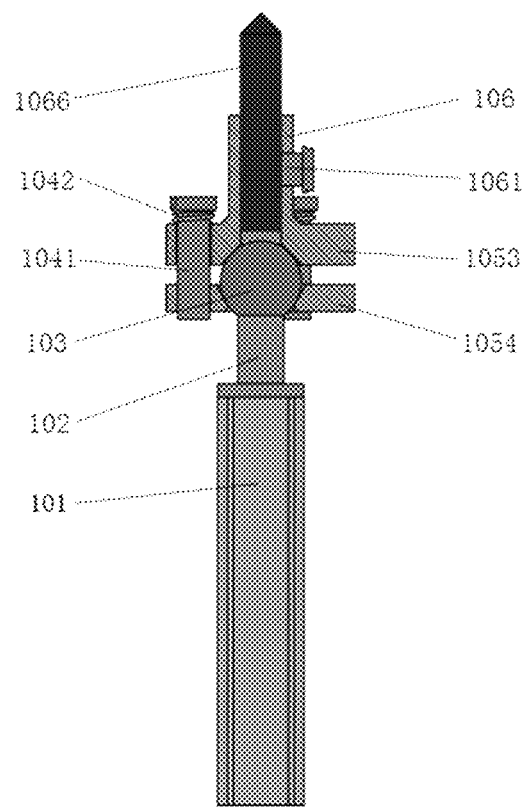
FIG. 4 is a schematic diagram of a first sample fixture.

As shown in FIG. 4, the sample fixture is a casing 106, and the casing 106 is integrated with the first pressing component 1053, and a pre-tightening screw 1061 is mounted through the wall of the casing 106. The rod-shaped or tube-shaped sample is inserted into the casing 106, and the sample is pressed by a pre-tightening screw 106, to complete the clamping of the sample.

Figure 5:
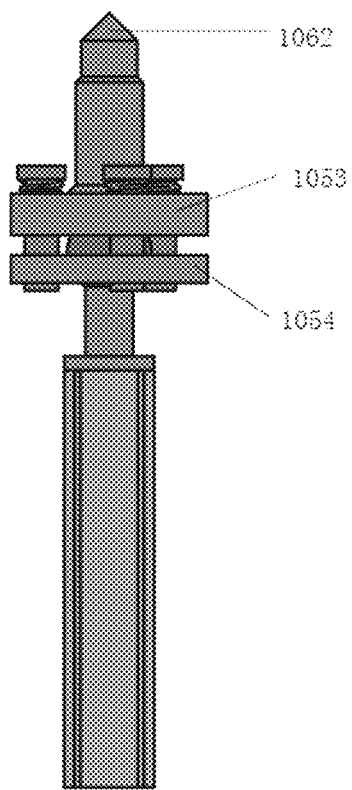
FIG. 5 is a schematic diagram of a second sample fixture.

FIG. 5 shows another form of the sample fixture. The sample fixture is a cone, and the cone 1062 is integrated with the first pressing component 1053. The powdered sample is glued to the apex of the cone 1062 to complete the clamping of the sample.

FIG. 6 shows another form of the sample fixture, the sample fixture includes a base 1063, a gasket 1064 and a fastening screw 1065; the base 1063 is divided into a connecting portion and a clamping portion, and the connecting portion is a cylinder fixed to the first pressing component, the clamping portion is an incomplete cylinder cut with a plane, the gasket 1064 is fastened to the clamping portion by a fastening screw 1065, and the sample 1066 is clamped between the plane of the clamping portion and the gasket 1064.

Figure 7:
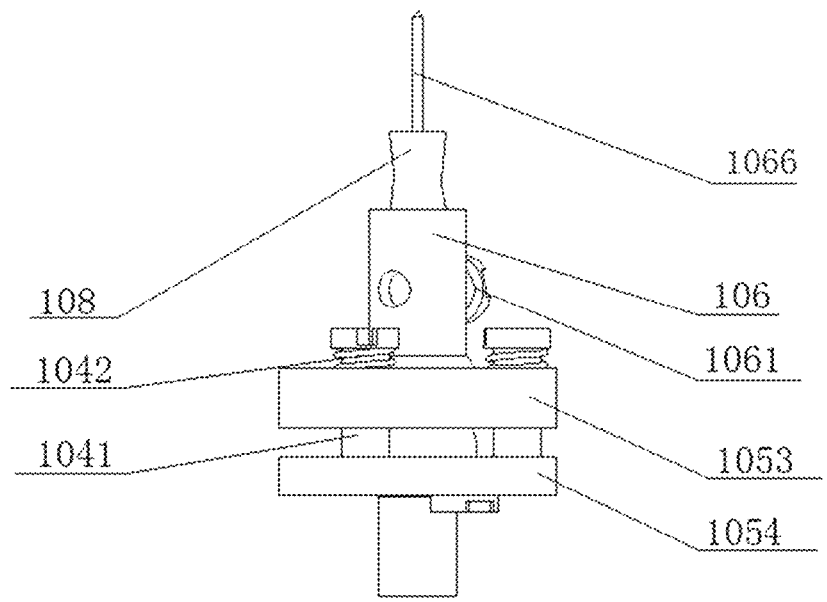
FIG. 7 is a schematic diagram of a fourth sample fixture.

FIG. 7 shows another form of the sample fixture, the sample fixture includes a clamping nozzle 108 and a casing 106. The clamping nozzle 108 is positioned in the casing 106. The casing 106 is integrated with the first pressing component 1053. A pre-tightening screw 1061 is mounted through the wall of the casing 106. The rod-shaped or tube-shaped sample is inserted into the clamping nozzle 108, and the clamping nozzle 108 is pressed by a pre-tightening screw 1061, to complete the clamping of the sample.

Lead-Out of Static Electricity

Since the TEM uses electron beam imaging, when the electron beams irradiate samples, static electricity will be accumulated on the TBO sample area to generate an electrostatic field. The electrostatic field will deflect the electron beams and affect the electron beam imaging Therefore, it is necessary to lead out the static electricity on TBO sample area.

Figure 8:
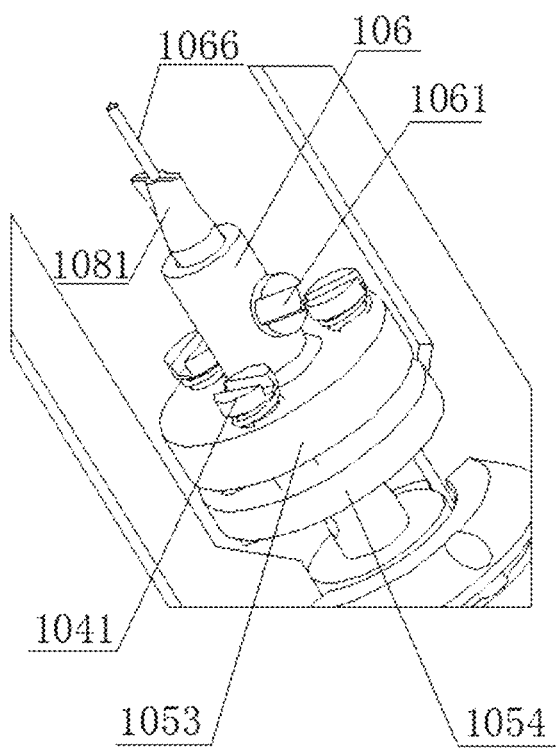
FIG. 8 is a schematic diagram showing the lead-out of static electricity.
Figure 9:
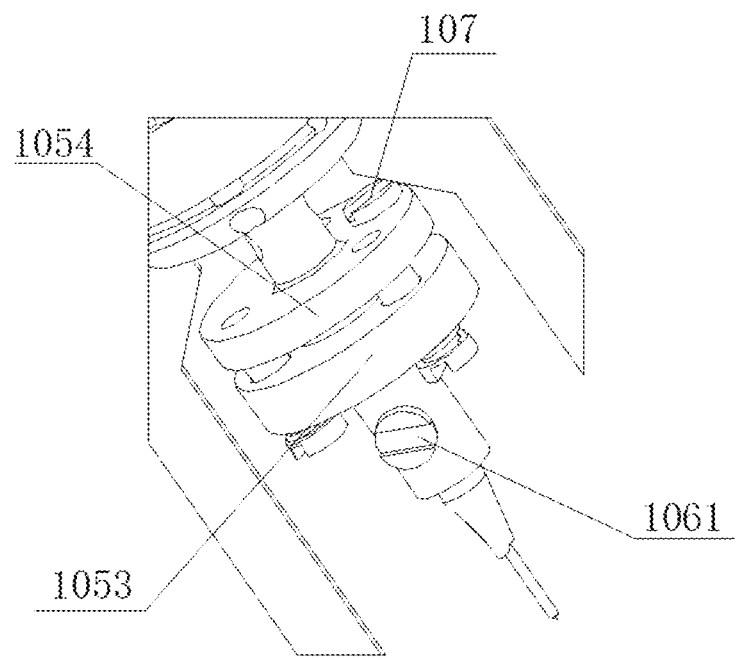
FIG. 9 is a schematic diagram showing mounting a conductive screw.

In some embodiments, as shown in FIG. 8 and FIG. 9, when the sample is a conductor or semiconductor, the head end of the nano-actuator is provided with a casing 106 for loading samples, the casing is provided with a pre-tightening screw 1061 for locking samples, the nano-actuator is provided with an electrostatic lead-out component 107 on the tail end. Both the pre-tightening screw 1061 and the electrostatic lead-out component 107 are conductive. An electrical path that communicates with the pre-tightening screw 1061 and the electrostatic lead-out component 107 is arranged on the nano-actuator, the electrostatic lead-out component 107 is connected to the wire, the wire is grounded, or connected to the constant voltage power supply provided by the external device, or connected to the shaft of the sample holder, and then to the TEM. By this way, the static electricity on the TBO sample area is transmitted to the pre-tightening screw 1061 through the samples, and the pre-tightening screw 1061 reaches the electrostatic lead-out component 107 through the electrical path on the nano-actuator, and the current on the electrostatic lead-out component 107 is led out through the wire.

As a specific embodiment, the electrical path may be a wire connecting the pre-tightening screw 1061 and the electrostatic lead-out component 107, and it is only necessary to set the length of the wire redundantly such that the wire does not affect the motion of the nano-actuator. Or, the nano-actuator adopts the above-mentioned structure, as shown in FIG. 8 and FIG. 9, the casing 106 is arranged on the first pressing component 1053, the electrostatic lead-out component 107 is fixedly mounted on the second pressing component 1054, and the first pressing component 1053, the casing 106 and the second pressing component 1054 are all conductors. At least one elastic connecting component 104 is provided between the first pressing component 1053 and the second pressing component 1054. The elastic connecting component 104 includes a screw rod 1041 and a spring 1042. The spring 1042 is sleeved on the screw rod 1041. Both screw rod 1041 and spring 1042 are conductors. The surface of the through hole corresponding to the first pressing component 1053 and the screw rod 1041 remains conductive. Thus, the flow direction of static electricity is as follow: sample→pre-tightening screw→first pressing component→spring→screw rod→second pressing component→electrostatic lead-out component.

As a specific embodiment, the electrostatic lead-out component 107 is a conductive screw, the second pressing component 1054 is provided with a screw hole mating with the conductive screw, the nut of the conductive pressing screw is in the direction away from the first component 1053, and the wire is positioned between the nut of the conductive screw and the second pressing component 1054. Thus, the mounting of the conductive screw is facilitated, and the wire is fixed to the conductive screw. The screw rod portion of the conductive screw is positioned in the second pressing component 1054. In other words, except for the head portion, the remaining part of the conductive screw is positioned in the second pressing component 1054, and its tail portion does not protrude from the second pressing component 1054, nor screw into the first pressing component 1053. Thus, the influence of the relative motion between the first pressing component 1053, the joint ball 103 and the second pressing component 1054 on the stability of the conductive screw is avoided. The tail portion of the conductive screw is fixed with the second pressing component 1054 by spot welding. The conductive screw is fixed in the second pressing component 1054 by the spot welding, to maintain the stability of current transmission, and prevent the conductive screw from falling off the second pressing component 1054 and falling. TEM is very expensive and difficult to maintain. Once parts or samples fall in the sample chamber of the TEM, it will cause huge losses, and the sample chamber space is limited, and the dropped parts are difficult to take out. Therefore, the reliability of the connection of each part of the sample holder is very important. The head portion of the conductive screw is exposed to the second pressing component 1054. In this way, the wire can be pressed tightly between the conductive screw and the surface of the second pressing component 1054, the wire does not need to be embedded in the screw hole of the second pressing component 1054, and the wire is not easily broken.

Sample Holder Nozzle

Samples need to be loaded on the sample holder through the sample holder nozzle. For example, the sample is a rod with a diameter of 0.3 mm and a length of 10 mm. The TBO sample area is an area with a thickness of less than 100 nm at one end of the sample, for example, a needle tip or attached nanoparticles. There may be one or multiple areas to be observed on each sample. When conducting sample observation experiment, the samples rotate around the axis. In order to keep the TBO sample area always within the observation field of the TEM, the TBO sample area should be as close as possible to the rotating shaft. The usual way to mount samples is to provide a casing at the front end of the sample holder, and the pre-tightening screw presses the sample against the wall of the casing from one side. To make samples to be loaded into the casing smoothly and non-destructively, the inner diameter of the casing needs to be thicker than the sample. Therefore, the TBO sample area will inevitably deviate from the center axis of the sample holder. However, the observation scale of TEM is usually micron or nanometer. When observing the TBO sample area, it is likely that the TBO sample area is beyond the observation field of the TEM after the piezoelectric rubbing mechanism rotates the sample. In order to be able to observe samples of various sizes, a sample holder nozzle is arranged to mount the sample, and the sample and sample holder nozzle are mounted as sample components into the front end of the sample holder, to facilitate assembly and disassembly.

Figure 10:
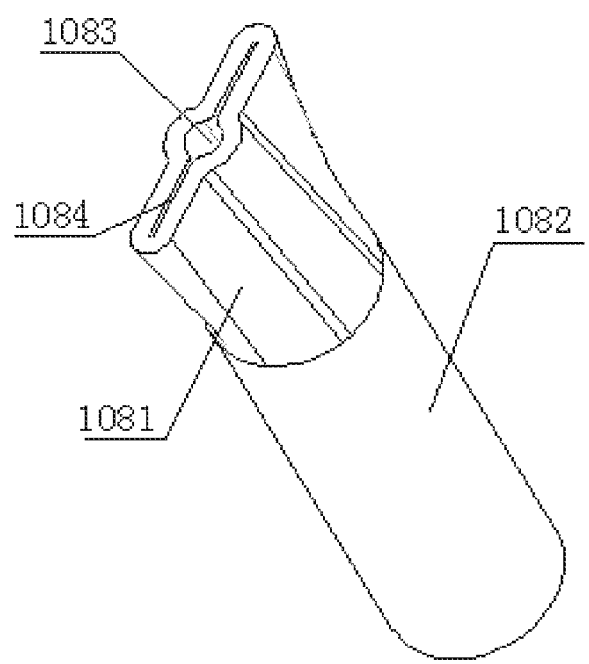
FIG. 10 is a schematic diagram of a sample holder nozzle.

As a preferred embodiment, as shown in FIG. 10, the sample holder nozzle 108 includes a clamping portion 1081 and a connecting portion 1082, and the sample is loaded on the clamping portion 1081. A sample loading hole 1083 is provided in the midline position of the clamping portion. The sample is loaded in the sample loading hole 1083. When clamping the sample, samples are partially inserted into a copper tube, then the inserted copper tube is clamped at one end with tools (such as pliers, etc.) to make the inner surface of the copper tube to fit the samples to form an arch as the clamping portion 1081, thereby the samples are limited at the arch to complete the assembly of the samples with the sample holder nozzle 108. The connecting portion 1082 of the sample holder nozzle is in clearance fit with the casing 106, for example, if the casing 106 is circular, the connecting portion 1082 is cylindrical, as long as the connecting portion 1082 can be clearance fit with the casing 106. Thus, the pre-tightening screw 1061 directly abuts tightly the sample holder nozzle, samples of any size can be installed on the sample holder nozzle, and then the sample components are mounted on the sample holder. In this way, the sample holder can be loaded with good versatility. The pre-tightening screw 1061 just needs to abut the sample holder nozzle. The pre-tightening screw 1061 does not touch the sample nor cause damage to the sample; in addition, the mounting clearance between the sample holder nozzle 108 and the sample holder can be arranged as small as possible to ensure that the sample is as close as possible to the axis of the sample holder.

As a specific embodiment, a buffer gap 1084 that is in communication with the sample loading hole 1083 is opened on two sides of the sample loading hole 1083 symmetrically. When the size of the sample loading hole 1083 is smaller than the sample size, the buffer gap 1084 can make the sample loading hole 1083 to have a space with increased size, such that the sample can be loaded into the sample loading hole 1083 smoothly. The clamping portion 1081 gradually shrinks from the bottom to the top, and the top is flat. The flat top reduces the space occupied by the sample holder nozzle 108, to facilitate sample handling. The clamping portion 1081 is hollow. The hollow clamping portion 1081 can increase the extension length of the sample.

As a specific embodiment, the clamping portion 1081 and the connecting portion 1082 are fixedly connected, or integrally formed, with the clamping portion 1081 on the upper side and the connecting portion 1082 on the lower side. The connecting portion 1082 is a solid column, or the connecting portion 1082 is hollow. Here, the fixed connection refers to methods such as welding. When the connecting portion 1082 is a solid column, the solid column is not prone to squeeze deformation, and the pre-tightening screw 1061 resists the solid column to maintain the reliability of the mounting of the sample and sample holder nozzle. When the connecting portion 1082 is hollow, the extension length of the sample can be further increased, and the manufacturing cost of the sample holder nozzle 108 can be reduced.

Preferably, a pit is provided on the connecting portion 1082. The pre-tightening screw 1061 is correspondingly inserted into the pit of the connecting portion 1082, which can prevent the sample from rotating and displacing while locking the connecting portion 1082.

The sample holder nozzle 108 is a conductor, which facilitates the discharge of static electricity accumulated on the TBO sample area. The sample holder nozzle 108 may be a thin-walled copper tube. The thin-walled copper tube has a low cost and can be adapted to samples of different diameters. When the sample holder has a clamping nozzle, the static current direction is as follow: sample→clamping nozzle→pre-tightening screw→first pressing component→spring→screw rod→second pressing component→electrostatic lead-out component.

Method for Aligning Samples to the Rotating Shaft Axis

In order to keep the TBO sample area within the observation field of the TEM when the rotating shaft rotates, it is necessary to make the TBO sample area as close as possible to the rotating shaft axis of the rotating shaft.

The method of adjusting the TBO sample area to the rotating shaft axis of the rotating shaft includes the following steps:

S1. Making the above sample holder nozzle, clamping the sample in the sample holder nozzle, and then mounting the sample holder nozzle into the sample holder fixture;

S2. Inserting the sample holder with the sample into the TEM, finding one TBO sample area, and selecting a feature point of the TBO sample area based on the principle of easy identification of the feature point during the rotation;

S3. Rotating the rotating shaft to 0°, and recording the position where the feature point of the sample is projected on the electron microscope screen as D1; rotating the rotating shaft to 180° and recording the position where the feature point of the sample;

S4. Driving the nanopositioner along the Y direction, and moving the position where the feature point of the sample is projected on the electron microscope screen to the central position Dz of D1 and D2;

S5. Rotating the rotating shaft to 90°, driving the nanopositioner along the Z direction, moving the position where the feature point of the sample is projected on the electron microscope screen to Dz;

S6. Rotating the rotating shaft to 0°, driving the nanopositioner along the Y direction, moving the position where the feature point of the sample is projected on the electron microscope screen to Dz;

S7. Repeating S5 and S6 until the position where the feature point of the sample is projected on the electron microscope screen remains unchanged at the horizontal position under the electron microscope when rotating back and forth;

S8. Increasing the magnification of the TEM and repeating S3 to S7, until the random movement caused by mechanical error is not negligible, indicating that the feature point of the sample is accurately positioned on the rotating shaft.

The movement back and forth may be coupled during the rotation. After each rotation, the piezoelectric rubbing mechanism needs to be driven to move the position where the feature point of the sample is projected on the electron microscope screen to the same X position along the X direction.

The overall diameter of the TEM sample holder is about 15 mm Considering that the O-ring groove for sealing needs to be mounted and enough structural stiffness is reserved, the spatial diameter of the rotating shaft is not more than 10 mm Self-Positioning of the Sample Holder Axis In order to realize the 360° rotation of the sample around the shaft, the sample holder is disposed to include a housing 109 and a rotating shaft 110, the housing 109 and the rotating shaft 110 are coaxial. The rotating shaft 110 is positioned in the inner chamber of the housing 109; the inner chamber is provided with a piezoelectric rubbing mechanism that rubs the rotation of the rotating shaft and a self-positioning mechanism; the self-positioning mechanism is provided with a symmetrical inclined plane, and the inclined plane is in contact with the rotating shaft. No matter how the rotating shaft rotates, due to the effect of the inclined plane, the central axis of the rotating shaft can always be automatically reset to the original position, thereby preventing the TBO sample area from being out of the TEM observation field caused by the shift of the center of the rotating shaft 110. Preferably, the rotating shaft 110 is a ceramic shaft.

Figure 11:
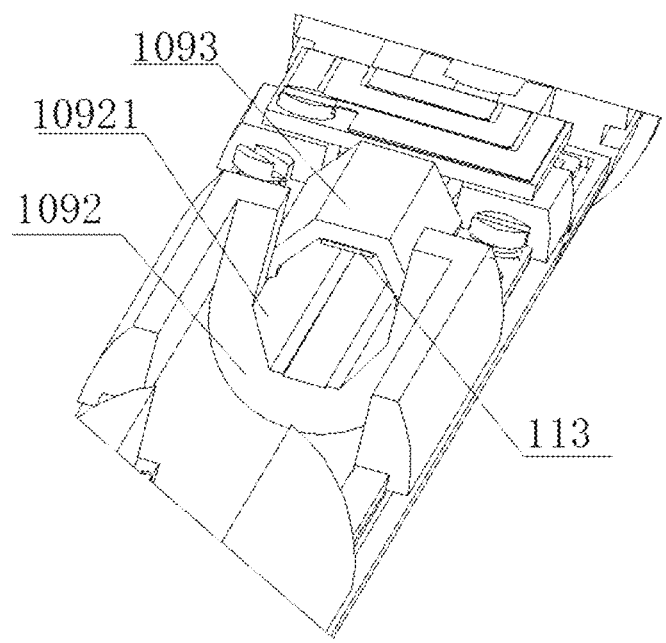
FIG. 11 is a schematic diagram showing the coordination of a supporting block and a pressing plate.

As a preferred embodiment, the self-positioning mechanism includes a supporting block 1092. As shown in FIG. 11, the supporting block 1092 is provided with a symmetrical inclined plane 10921, and the inclined plane of the supporting block 1092 is in contact with the rotating shaft 110. Preferably, the inclined plane 10921 of the supporting block 1092 has a wear-resistant layer 113, and the wear-resistant layer 113 is a part that is in contact with the rotating shaft 110. Preferably, a plurality of supporting blocks 1092 is distributed along the axial direction of the rotating shaft 110.

Figure 12:
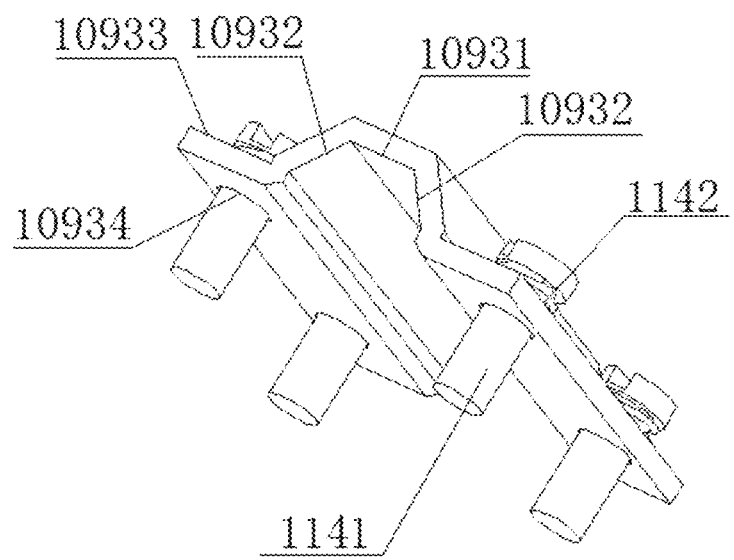
FIG. 12 is a structural representation of a pressing plate.

As a preferred embodiment, the self-positioning mechanism includes a pressing plate 1093, as shown in FIG. 11 and FIG. 12, the pressing plate 1093 has a flat plate 10931, and a slope 10932 is symmetrically arranged on both sides of the flat plate 10931. The rotating shaft 110 is limited between the supporting block 1092 and the pressing plate 1093, such that the rotating shaft 110 does not move up and down or move on the left and right when rotating around the shaft. Preferably, each supporting block 1092 is corresponding to a pressing plate 1093, with the supporting block 1092 at the bottom and the pressing plate 1093 at the top. Or, the self-positioning mechanism includes a plurality of supporting blocks 1092 and a pressing plate 1093.

As shown in FIG. 12, the pressing plate 1093 is provided with a pair of mounting wing 10933, and fixing holes 10934 are arranged on the mounting wings 10933; the mounting wing 10933 is positioned at one end of the slope 10932. A wear-resistant layer 113 is provided on the inside of the flat plate, and the wear-resistant layer 113 is the part that is in contact with the rotating shaft 110.

A frame 112 is provided between the housing 109 and the rotating shaft 110, and the mounting wing 10933 is assembled to the frame 112 through an elastic mounting assembly 114. As shown in FIG. 12, the elastic mounting assembly 114 is composed of a screw rod 1141 and a spring 1142. The spring 1142 is sieved on the shaft of the screw rod 1141, and the spring 1142 is positioned between the mounting wing 10933 and the nut of the screw rod 1141. The elastic mounting assembly 114 enables the pressing plate 1093 to move slightly along the radial direction of the rotating shaft 110, which not only preloads the rotating shaft 110, but also allows the rotating shaft 110 to rotate. The rotating shaft 110 is limited between the pressing plate 1093 and the supporting block 1092, and the pre-tightening force is adjusted by rotating the screw rod 1141 during assembly. After the assembly is completed, the spring 1142 will not continue to deform during use.

Rotating Shaft Drive Assembly

As a preferred embodiment, at least one set of rotating shaft drive assembly is arranged between frame 112 and rotating shaft 110. The rotating shaft drive assembly is a piezoelectric rubbing mechanism. Each set of rotating shaft drive assembly includes a drive unit, and the drive unit includes a substrate and a piezoelectric ceramic sheet. The substrate is insulator, or substrate is printed circuit board.

An embodiment for driving the rotating shaft to move in the axial direction: the rotating shaft drive assembly includes an axial drive unit. The shear deformation direction of the piezoelectric ceramic sheet of the axial drive unit is consistent with the axial direction of the rotating shaft. The piezoelectric ceramic sheet is bonded to the substrate. A conductive coating is coated on the surface of both sides of the piezoelectric ceramic sheet. When driving, voltage signals are input between conductive coatings, for example, continuous or intermittent sawtooth waves are input, etc.

An embodiment for the rotation of the rotating shaft: the rotating shaft drive assembly includes a rotating drive unit. The shear deformation direction of the piezoelectric ceramic sheet of the rotating drive unit is consistent with the circumferential direction of the rotating shaft 110. The piezoelectric ceramic sheet is bonded to the substrate, and a conductive coating is coated on the surface of both sides of the piezoelectric ceramic sheet. When driving, voltage signals are input between conductive coatings, for example, continuous or intermittent sawtooth waves are input, etc.

An embodiment of combination of rotation and axial movement of rotating shaft: the drive unit of the rotating shaft drive assembly includes a substrate, a first piezoelectric ceramic sheet and a second piezoelectric ceramic sheet; the deformation direction of the first piezoelectric ceramic sheet and the deformation direction of the second piezoelectric ceramic sheet are orthogonal, a conductive coating is coated on the surface of both sides of the first piezoelectric ceramic sheet and second piezoelectric ceramic sheet. When driving, voltage signals are input between conductive coatings, for example, continuous sawtooth waves are input, etc.

The deformation direction of the first piezoelectric ceramic sheet and the deformation direction of the second piezoelectric ceramic sheet are orthogonal, for example, the deformation direction of the first piezoelectric ceramic sheet is along the axis of the rotating shaft (forward and backward direction), which is used to drive the rotating shaft 110 to translate forward and backward. The deformation direction of the second piezoelectric ceramic sheet is along the circumferential direction of the rotating shaft (the direction of rotation), which is used to rub the rotating shaft 110 to rotate. The first piezoelectric ceramic sheet is stacked on the second piezoelectric ceramic sheet, or the second piezoelectric ceramic sheet is stacked on the first piezoelectric ceramic sheet; the first piezoelectric ceramic sheet and the second piezoelectric ceramic sheet are fixed by bonding. The drive unit is provided with a wear-resistant layer 113. The wear-resistant layer 113 is in direct contact with the rotating shaft 110, reducing wear and extending the service life of the drive unit. The surface of the first piezoelectric ceramic sheet on one side is connected to the surface of the second piezoelectric ceramic sheet on one side, sharing a wire.

Preferably, two or three groups of rotating shaft drive assemblies are arranged along the axis of the rotating shaft 110. One group of rotating shaft drive assemblies make limited forces for the rotation and axial movement of the rotating shaft, and multiple groups of rotating shaft drive assemblies are arranged to apply forces in the same direction to the rotating shaft 110, which facilitates the rotation and axial movement of the rotating shaft. However, if too much rotating shaft drive assemblies are arranged, it is easy to cause disorder in force.

Figure 13:
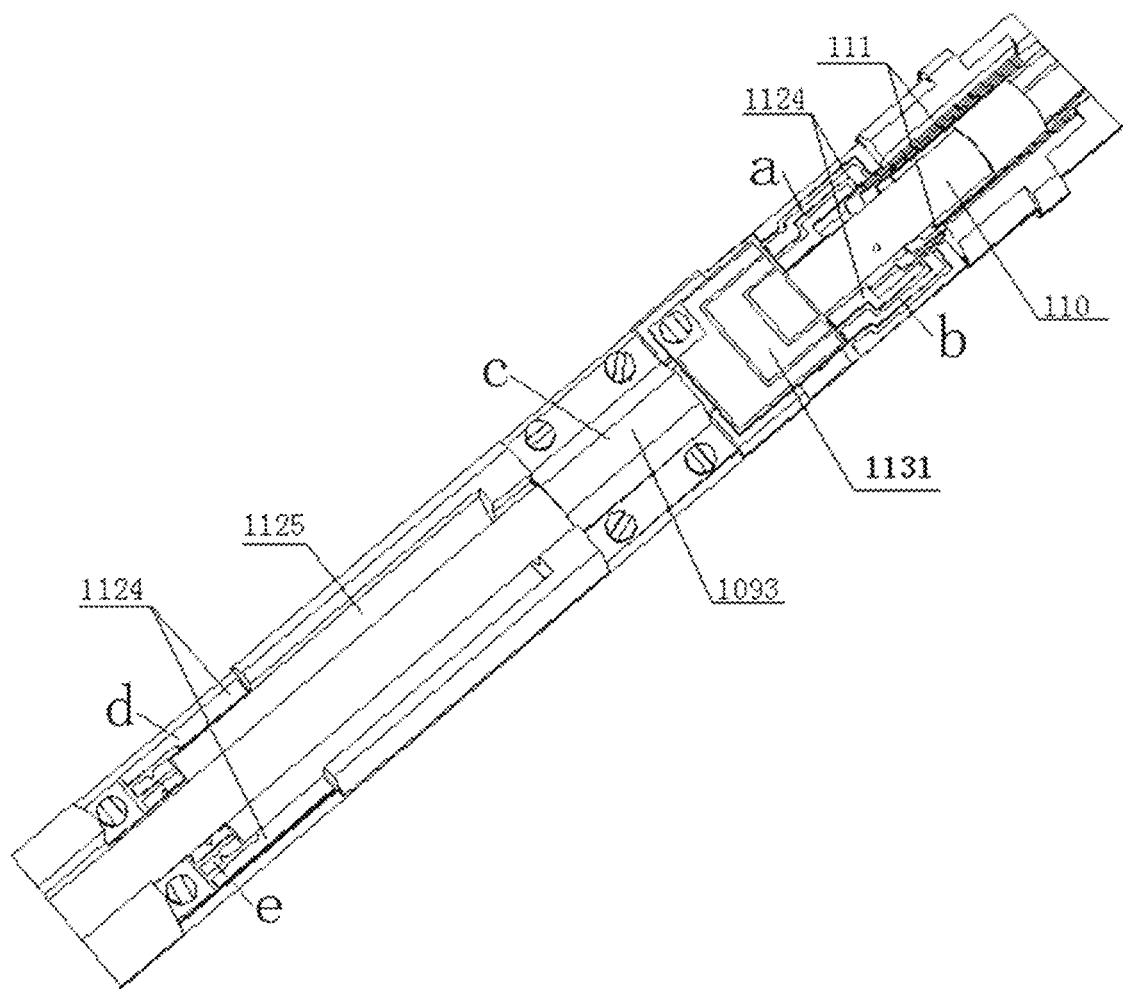
FIG. 13 is a schematic diagram showing the distribution of a drive unit.
Figure 14:
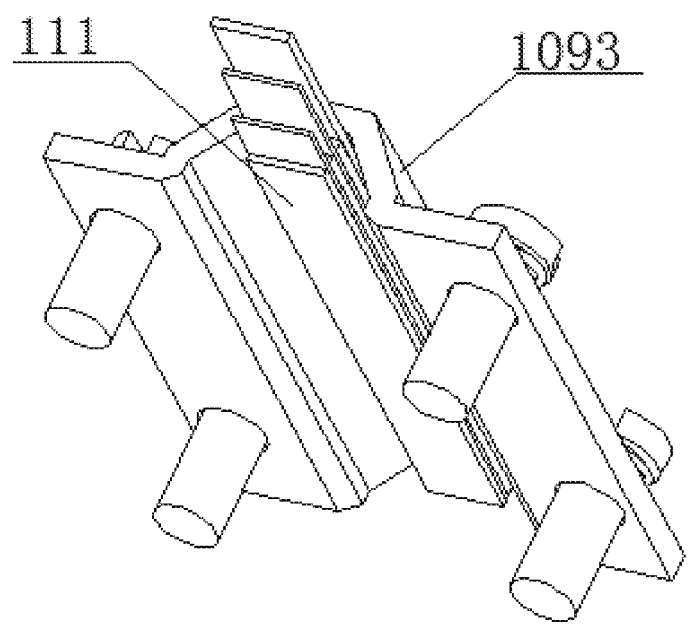
FIG. 14 is a schematic diagram of a pressing plate with a drive unit.

Embodiment of a rotating shaft driven by two points: A group of rotating shaft drive assemblies is arranged along the axial direction at the front end of the rotating shaft. This group of rotating shaft drive assemblies includes two groups of drive units symmetrically arranged along the rotating shaft. The left and right sides of the rotating shaft are respectively subjected to a driving force provided by the drive unit, the contact points of the wear-resistant sheets are flush with the contact points of the rotating shaft 110 on the surfaces of the two drive units. Referring to FIG. 13, a and b in the figure are two groups of drive units 111 respectively.

Figure 15:
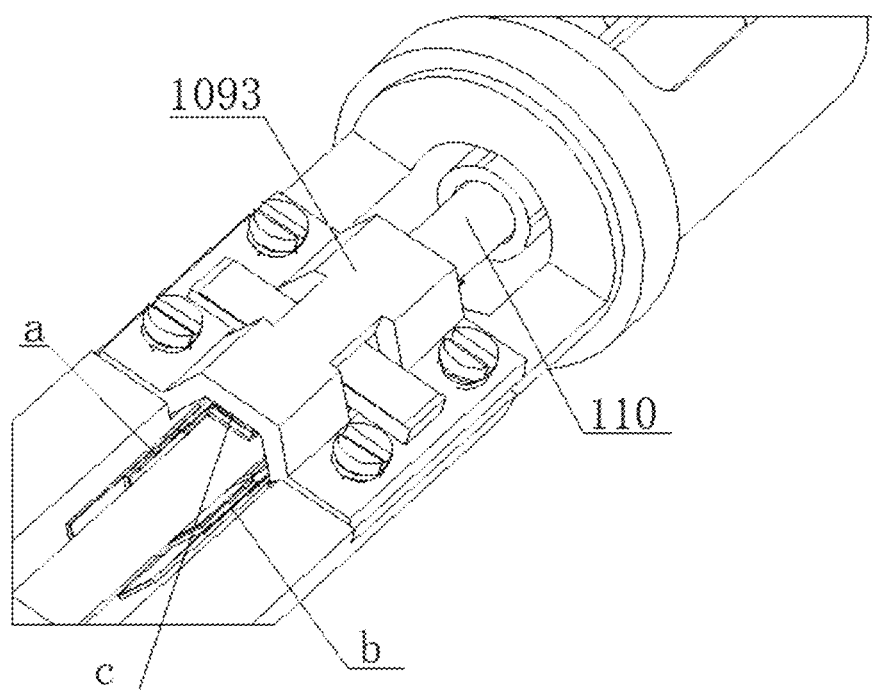
FIG. 15 is a schematic diagram of a rotating shaft driven by three points.

Embodiment of a rotating shaft driven by three points: when two groups of rotating shaft drive assemblies are arranged, the front end of the rotating shaft 110 is provided with a group of rotating shaft drive assemblies along the axial direction, and the front end of the rotating shaft drive assembly includes two groups of drive units arranged symmetrically along the rotating shaft. A group of rotating shaft drive assemblies is arranged between the pressing plate 1093 and the rotating shaft 110, and the group of rotating shaft drive assemblies includes a group of drive units. The pressing plate 1093 should be positioned above the two groups of drive units, and the contact points of the wear-resistant sheets are flush with the contact points of the rotating shaft 110 on the surfaces of the three groups of drive units. "Flush" means axial flush. If the contact points are staggered along the axial direction of the rotating shaft 110, the rear end of the rotating shaft 110 is prone to tilt. A through hole is provided on the pressing plate 1093 laterally, and the copper foil passes through the through hole. The copper foil is used as the lead-out medium of the drive unit electrode and is connected to the external wire. Referring to FIG. 15, a, b, and c in the figure are three groups of drive units 111 respectively.

Embodiment of a rotating shaft driven by five points: when five groups of rotating shaft drive assemblies are arranged, two groups of rotating shaft drive assemblies are arranged symmetrically along the axial direction at the front and rear ends of the rotating shaft 110, and each group of rotating shaft drive assemblies includes two groups of drive units symmetrically arranged along the rotating shaft. A group of rotating shaft drive assemblies is arranged in the middle of the rotating shaft 110. The group of rotating shaft drive assemblies includes a group of drive units. The group of drive units is positioned between the pressing plate 1093 and the rotating shaft 110. Among them, the contact points of the wear-resistant sheets are flush with the contact points of the rotating shaft 110 on the surfaces of two groups of drive units at the front and rear ends of the rotating shaft 110. Referring to FIG. 13, a, b, c, d, and e in the figure are five groups of drive units 111 respectively.

Frame

Figure 21:
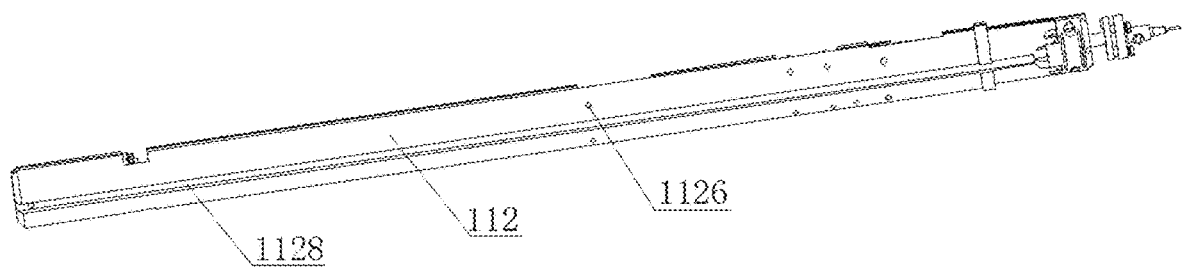
FIG. 21 is a schematic diagram of a frame with a wiring groove.
Figure 22:
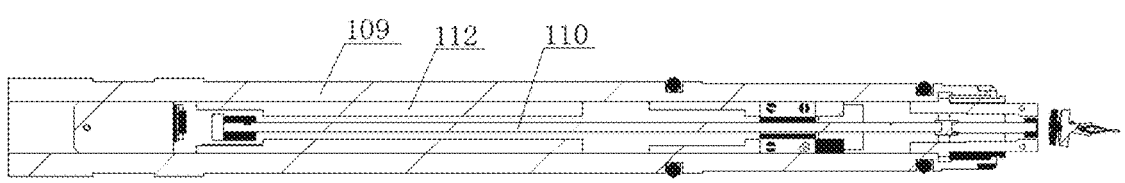
FIG. 22 is a schematic diagram of a sample holder with a housing.

As shown in FIG. 21, the frame 112 is provided between the housing 109 and the rotating shaft 110, and the frame 112 is coaxial with the housing 109 and the rotating shaft 110. The frame 112, as a transitional component between the rotating shaft 110 and the housing 109, makes the rotating shaft 110 and the frame 112 to be coaxial, and then the rotating shaft-frame is mounted into the housing to make the rotating shaft 110, the frame 112 and the housing 109 to be coaxial to improve the mounting accuracy. In addition, the frame 112 further provides mounting positions for the rotating shaft drive assembly, and the frame 112 further functions to separate the rotating shaft from the wire and prevent the wire from interfering with the motion of the rotating shaft.

Figure 16:
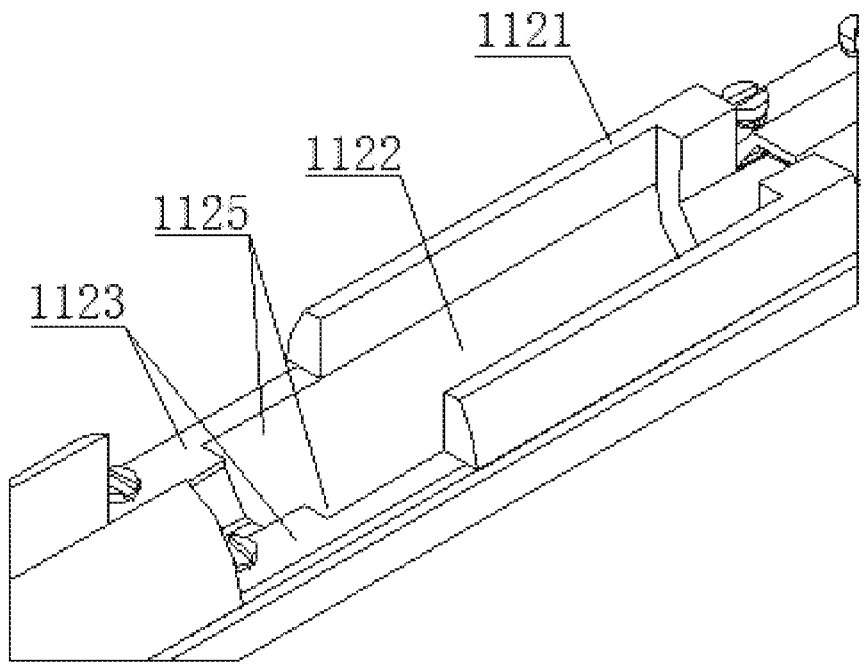
FIG. 16 is a structural representation of a frame.

As shown in FIG. 16, the frame 112 is provided with a matching portion 1121 that is clearance fit with the inner wall of the housing 109, a receiving groove 1122 for accommodating a rotating shaft, and a mounting portion 1123 for carrying accessories. The receiving groove 1122 is provided with a symmetrical inclined plane, and the mounting portion 1123 is fixedly provided with a printed circuit board 1124, and the printed circuit board 1124 is provided with connecting wire. The connection circuit board is a printed circuit board.

The supporting block 1092 is fixed to the receiving groove 1122, and the receiving groove 1122 is arranged in multiple sections along the axial of the frame 112; a mounting chamber 1125 for accommodating a rotating shaft drive assembly is arranged on the frame 112, and the receiving groove 1122 and the mounting chamber 1125 are spaced apart. After the rotating shaft drive assembly is mounted in place, the wear-resistant layer of the rotating shaft drive assembly forms an inclined plane that limits the rotating shaft.

Each drive unit has its own connecting circuit board 1124 for current flow, the connecting circuit board is a printed circuit board, and the connecting circuit board 1124 is provided with a circuit electrically connected to the rotating drive assembly; each rotating shaft drive assembly is corresponding to an adapter circuit board 1131, and the adapter circuit board 1131 is a printed circuit board, and the adapter circuit board 1131 is provided with a connecting circuit; the current of the connecting circuit board 1124 is collected in the connecting circuit board 1131, the adapter circuit board 1131 is connected to the transmission wire, and the transmission wire is connected to the signal connector on the sample holder. The signal connector is connected with an external signal source to output control signals. The circuit board is adopted to realize the transmission of electrical signals to avoid interference with the rotation of the rotating shaft by a wire.

As a specific embodiment, the adapter circuit board 1131 is fixed to the frame 112, and the rotating shaft 110 is positioned below the adapter circuit board 1131, as shown in FIG. 13. The adapter circuit board 1131 is positioned between the pressing plate 1093 and the rotating shaft drive assembly. The adapter circuit board 1131 is a printed circuit board. The area of the drive unit 111 that can be welded is limited and the welding is not strong. The adapter circuit board 1131 is used to reduce the contact with the wire on the drive unit during the assembly process to protect the solder joints. The 6 wires that are led out of the left and right drive units of the adapter circuit board 1131 (9 wires in total including the drive unit under the pressing plate in the case of three-point drive) are connected into 3 wires, to simplify the electrical connection.

Preferably, the connecting circuit board 1124 and the adapter circuit board 1131 are electrically connected by wires.

Preferably, the frame 112 is cylindrical, a groove is cut on one side of the frame 112, and the groove runs through the axial of the frame 112, and the receiving groove 1122 and the mounting chamber 1125 are both positioned on the groove; a notch is provided at the position where the connecting circuit board 1124 is placed using an arc surface of the frame 112 as a bottom and an opening of the groove as a top, and the notch is formed by cutting part of the frame wall from the top to the bottom. The walls at both ends of the notch play a role in positioning the connecting circuit board 1124.

Preferably, the width of each connecting circuit board 1124 is less than or equal to the wall thickness of the frame, and the connecting circuit board 1124 is fixed to the top surface of the notch with a screw.

Preferably, the plane of the frame wall where the adapter circuit board 1131 is arranged is higher than the plane of the frame wall where the connecting circuit board 1124 is arranged. Thus, the adapter circuit board 1131 is partially suspended and mounted with the connecting circuit board 1124 thereunder, saving the mounting space; in addition, a gap is provided between the adapter circuit board 1131 and the connecting circuit board 1124, to avoid short circuit in wires.

Preferably, as shown in FIG. 21, the frame 112 is provided with a mounting threaded hole 1126, and the threaded hole 1126 penetrate through the frame 112 from top to bottom. The threaded holes 1126 are all through holes, which facilitate to clean the frame 112, keep the sample holder clean, and avoid contamination and interference with the sample chamber in the TEM.

Connection to Optical Fiber

Optical fiber is connected to the sample holder. The functions of the optical fiber: 1) to adjust the light source to a specific spectrum of light, introduce the light into the electron microscope, irradiate the sample, and apply electromagnetic field; 2) to collect the light emitted/reflected from the sample, and transmit the light to the electron microscope for measurement and analysis, for example, measuring the black-body radiation emitted by the sample to measure the sample temperature.

Figure 20:
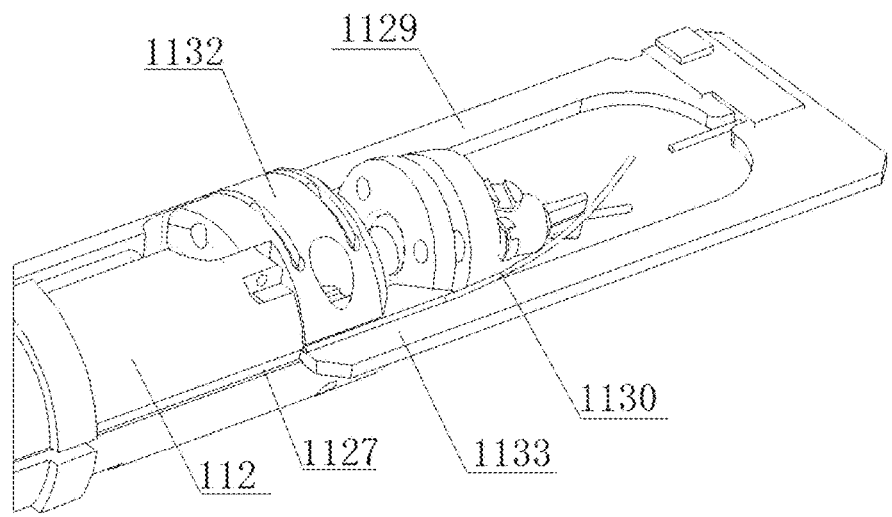
FIG. 20 is a structural representation of a frame with an optical fiber groove.

As a preferred embodiment, as shown in FIG. 20, the optical fiber groove 1127 is provided on the side of the frame 112, and the optical fiber groove 1127 penetrates through the frame 112 axially. The optical fiber passes through the optical fiber groove 1127, which can avoid the wear of the optical fiber.

As a preferred embodiment, the head portion of the sample holder has a front-end circuit board 1129, the front-end circuit board 1129 is engaged with the optical fiber groove 1127, and the front-end circuit board 1129 and the optical fiber groove 1127 are positioned in the same straight line. The optical fiber groove 1127 is provided on the side of the frame 112, because the head portion of the sample holder has a front-end circuit board 1129. The optical fiber groove 1127 is engaged with the front-end circuit board 1129. The front-end circuit board 1129 has the function of guiding the optical fiber 1130. The head portion of the optical fiber passes through the front-end circuit board 1129, and the head portion of the optical fiber has a smaller bending amplitude. If the bending amplitude of the optical fiberhead portion is too large, the light wave will be attenuated and the optical fiber may even be broken.

The front-end circuit board 1129 is mounted on the frame through the mounting block 1132. The mounting block 1132 fixes the front-end circuit board 1129 to the frame 112 by bolts. The front-end circuit board 1129 has a guiding plane 1133 for guiding the optical fiber, and the guiding plane 1133 is flush with the optical fiber groove 1127. The guiding plane 1133 extends in the direction of the sample holder nozzle, and the optical fiber approaches the sample along the guiding plane 1133.

Two optical fiber grooves 1127 are provided symmetrically on the frame 112. Correspondingly, the front-end circuit board 1129 has a symmetrical guiding plane 1133, and the guiding plane 1133 is engaged with the optical fiber groove 1127 one by one. Two optical fiber grooves 1127 are provided, and the optical fiber 1130 can pass through any one of the optical fiber grooves 1127, or two optical fibers 1130 can be used to pass through the two optical fiber grooves 1127 respectively. For example, introducing different light spectra; or one optical fiber emits light and the other collects light.

As shown in FIG. 16, the optical fiber groove 1127 and the connecting circuit board 1124 are positioned on the same straight line. That is, the connecting circuit board is arranged along the route where the optical fiber groove 1127 is positioned, and the lead wire of the connecting circuit board 1124 can be led out from the inner wall of the frame 112, or through the optical fiber groove 1127. In this way, the arrangement of the wire and the rotation of the rotating shaft 110 do not interfere with each other. The optical fiber groove 1127 is linear, and the optical fiber groove 1127 can accommodate at least an optical fiber with a diameter of 0.5 mm Lead-Out of Wires The wire connecting the front-end circuit board needs to be connected to the external control box. The wire passes from the outside of the frame 112, and the long-term contact friction not only causes wear to the wire, but also the wires are easy to entangle with each other due to small wire diameter and complex wires. At the bottom of the frame 112, a wiring groove 1128 is provided for wires to pass through, which can avoid the abrasion and entanglement of the wires.

As a preferred embodiment, as shown in FIG. 21, the bottom of the frame 112 is provided with a wiring groove 1128, and the wiring groove 1128 penetrates through the frame 112 axially, and the wiring groove 1128 is a groove that is open to the bottom.

Arrangement of Piezoelectric Ceramic Sheet and Electrodes

The piezoelectric ceramic sheet used to drive the rotating shaft to translate or rotate is a piezoelectric ceramic shear sheet that undergoes shear deformation under the action of an external electric field along the thickness direction.

Preferably, the conductive coatings are uniformly coated on the surfaces on both sides of the piezoelectric ceramic sheet, which are the upper-layer electrode and the lower-layer electrode.

Figure 17:
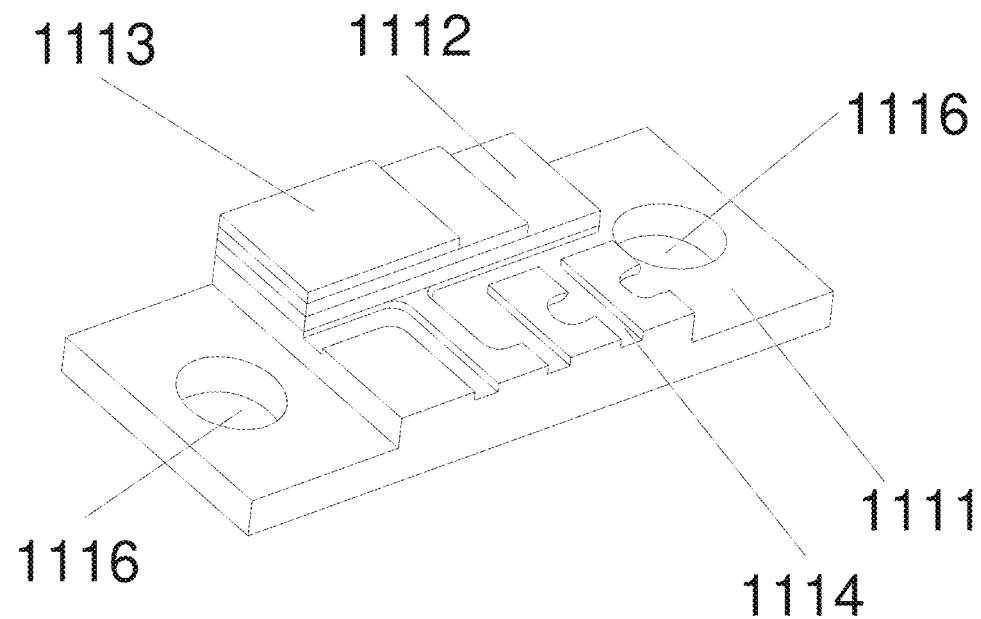
FIG. 17 is a first arrangement of a piezoelectric ceramic sheet and an electrode.

As a preferred embodiment, as shown in FIG. 17, drive unit 111 is provided with a substrate 1111, a piezoelectric ceramic sheet 1112 and a wear-resistant sheet. The substrate 1111 has ceramic sheet area 1113 and electrode area 1114, and the piezoelectric ceramic sheet is stacked and bonded to ceramic sheet area 1113. The electrode area 1114 is provided with multiple circuits, and the multiple circuits are electrically connected to the conductive coating on the surface of the piezoelectric ceramic sheet.

The ceramic sheet area 1113 is provided with one piezoelectric ceramic sheet, or stacked with at least two piezoelectric ceramic sheets 1112. When there are at least two piezoelectric ceramic sheets 1112, the telescopic direction of the piezoelectric ceramic sheets 1112 is different from each other.

Preferably, the substrate 1111 is a printed circuit board.

Preferably, the substrate 1111 is a metal-based printed circuit board.

Preferably, the substrate 1111 is an aluminum-based printed circuit board. Preferably, the substrate 1111 is provided with a recess and a pair of mounting holes 1116, the mounting holes 1116 are used as the front and rear ends of the substrate 1111, the ceramic sheet area 1113 and the electrode area 1114 are positioned in the center of the substrate, and the recess is positioned at the front and rear ends of the substrate 1111 and around the mounting hole; the ceramic sheet area 1113 and the electrode area 1114 are positioned on the left and right sides of the substrate 1111.

Preferably, the lower-layer electrode of the lowermost piezoelectric ceramic sheet is in direct contact with the ceramic sheet area 1113 on the substrate 1111, and is connected to the electrode area 1114 on the substrate 1111 through the circuit on the ceramic sheet area 1113; the upper-layer electrode of the uppermost piezoelectric ceramic sheet is provided with an area A and an area B on the surface; the wear-resistant sheet is pasted to the area A; the area B is electrically connected to an adapter cable; one end of the adapter cable is electrically connected to the electrode area 1114 on the substrate 1111.

Preferably, the adapter cable is soldered to the area B; or, the adapter cable is bonded to area B with a conductive adhesive.

Preferably, when there is a plurality of piezoelectric ceramic sheets, the upper-layer electrode of each layer of piezoelectric ceramic sheet other than the uppermost piezoelectric ceramic sheet has an overlapping area and an exposed area; the overlapping area is electrically connected to the lower-layer electrode of the upper layer of piezoelectric ceramic sheet of this layer of piezoelectric ceramic sheet; the exposed area is electrically connected to an adapter cable; one end of the adapter cable is electrically connected to the electrode area 1114 on the substrate.

Preferably, the adapter cable is soldered to the exposed area; or, the adapter cable is bonded to the exposed area with a conductive adhesive.

Preferably, the adapter cable is soldered to the electrode area 1114 on the substrate 1111.

Preferably, the overlapping area is in direct contact with the lower-layer electrode of the upper layer of piezoelectric ceramic sheet of this layer of piezoelectric ceramic sheet.

Or, in another arrangement of piezoelectric ceramic sheets and electrodes, the drive unit includes an electrode plate and a piezoelectric ceramic sheet, and the piezoelectric ceramic sheet is fixed by bonding on the surface of the electrode plate. The electrode plate is a conductor, and the electrode plate is electrically connected to the lead wire.

Figure 18:
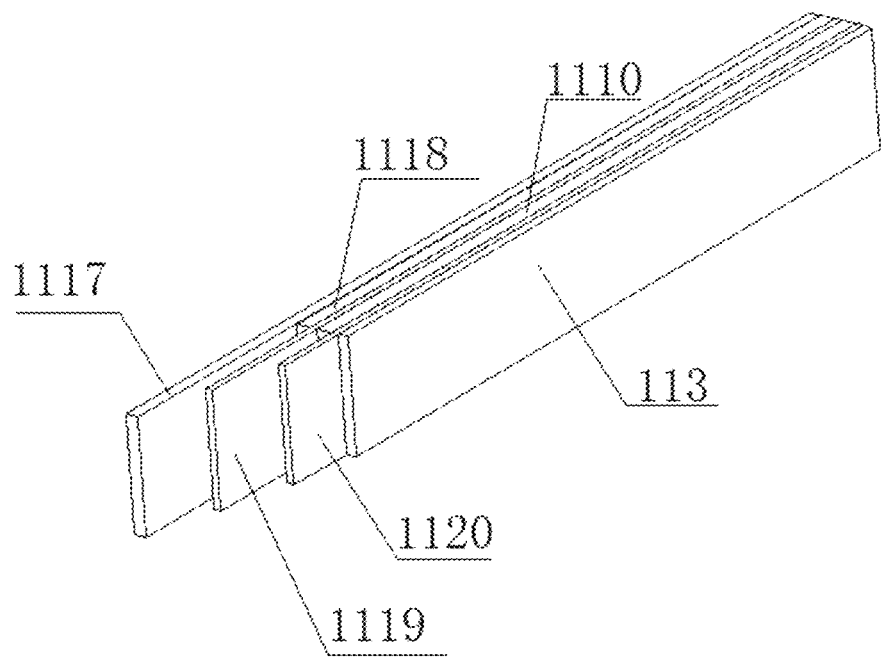
FIG. 18 is a second arrangement of a piezoelectric ceramic sheet and an electrode.
Figure 19:
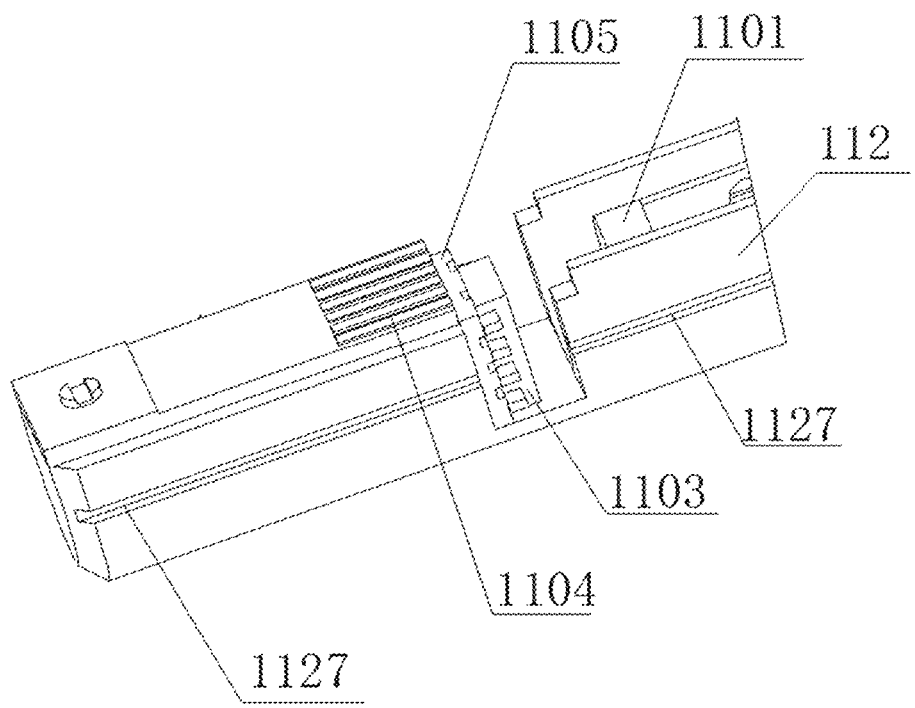
FIG. 19 is a schematic diagram showing the detection of the position information of the rotating shaft.

As shown in FIG. 18, the drive unit includes a first electrode plate 1117, a first piezoelectric ceramic sheet 1118 and a second electrode plate 1119. The first piezoelectric ceramic sheet 1118 is deformed by axial shear along the rotating shaft 110, or the first piezoelectric ceramic sheet 1118 is deformed by cyclic shear along the rotating shaft; the first piezoelectric ceramic sheet 1118 is positioned between the first electrode plate 1117 and the second electrode plate 1119, and the first electrode plate 1117 and the second electrode plate 1119 have their respective lead ends.

Preferably, the drive unit comprises a first electrode plate 1117, a first piezoelectric ceramic sheet 1118, a second electrode plate 1119, a second piezoelectric ceramic sheet 1110 and a third electrode plate 1120; the sequence of mounting is the first electrode plate 1117, the first piezoelectric ceramic sheet 1118, the second electrode plate 1119, the second piezoelectric ceramic sheet 1110, the third electrode plate 1120; the shear deformation direction of the first piezoelectric ceramic sheet 1118 is different from the shear deformation direction of the second piezoelectric ceramic sheet 1110; the third electrode plate 1120 is close to the rotating shaft 110 but not in contact with the rotating shaft 110.

Preferably, the first electrode plate 1117 is fixed by bonding on the insulating layer, the insulating layer is fixed by bonding on the frame or housing, and the third electrode plate 1120 is provided with a wear-resistant layer 113 that is in contact with the rotating shaft. The "first", "second", and "third" are just to illustrate that there are three electrode plates; the "first" and "second" are just to illustrate that there are two piezoelectric ceramic sheets.

Preferably, the first electrode plate, insulating layer and frame can be equivalent to capacitive load in the circuit, and the voltage required to drive each piezoelectric ceramic sheet is relatively high, so the voltage signal is prone to leak to the frame when each piezoelectric ceramic sheet is driven by a high-frequency signal, which may damage the electron microscope. Therefore, keeping the first electrode plate 1117 grounded can reduce the voltage leaking to the frame. By driving the second electrode plate 1119 and the third electrode plate 1120 with an appropriate voltage signal, the required electric field can also be obtained without affecting the realization of the driving function.

Position Information of Rotating Shaft

A magnet 1101 is provided at the end of the rotating shaft, the frame 112 is provided with a lead-out circuit board 1106. The magnetic field changes when the magnet rotates and moves back and forth. The magnetic field sensor measures the magnetic field, and the position information of the rotating shaft can be obtained through the magnetic field, that is, the rotation angle and the motion distance of the rotating shaft. Because the projection angle is required for 3D reconstruction, the rotation angle of the rotating shaft needs to be measured. The purpose of measuring the motion distance of the rotating shaft is to locate the sample at the position when the magnetic field sensor is calibrated, such that the error in measuring the angle of rotation of the rotating shaft is smaller. The current sample holder is driven by three degrees of freedom, while this sample holder is driven by four degrees of freedom, which adds the axial rotation of the rotating shaft. By measuring the rotation angle of the rotating shaft, it provides a projection angle for three-dimensional reconstruction.

A magnet 1101 is provided at the end of the rotating shaft 110, the frame 112 is provided with a lead-out circuit board 1106, the frame 112 is opened with a notch, the lead-out circuit board 1106 includes a bending portion 1105, and the bending portion 1105 is positioned in the notch. The magnetic field sensor 1103 is fixed on the bending portion 1105. The magnetic field sensor 1103 is placed in the notch to reduce the occupied space, thereby reducing the diameter of the housing of the suit frame. The space of the notch is much larger than the space required for accommodating the magnetic field sensor 1103, providing enough space for disassembly and maintenance of the magnetic field sensor 1103.

As a preferred embodiment, the lead-out circuit board 1106 includes a plane portion 1104, the plane portion 1104 and the bending portion 1105 are bent to cover the frame 112, the plane portion 1104 is connected with the bending portion 1105 by a wire, and the magnetic field sensor 1103 is connected with the bending portion 1105 through solder. The lead-out circuit board 1106 is a printed circuit board. The solder connection between the magnetic field sensor 1103 and the lead-out circuit board 1106 can not only fix the magnetic field sensor 1103, but also short-circuit one pair of pins on the lead-out circuit board 1106, reducing the number of wires that need to be connected.

As a preferred embodiment, the plane portion 1104 and the bending portion 1105 are in an "L" shape, and the magnetic field sensor 1103 is opposite to the magnet 1101. A bending circuit board is used, which occupies a small area and is easy to disassemble. If the circuit board is not bent, there is not enough space to place the screws, and it needs to be glued and fixed, which is difficult to disassemble and repair.

Preferably, the lead-out circuit board 1106 has two groups of leading-out terminals, one group of leading-out terminals is electrically connected to the wire of the drive unit 111, and the other group of leading-out terminals is electrically connected to the sample holder.

Method for In-Situ Dynamic 3D Reconstruction of Samples Using Multi-Degree-of-Freedom Sample Holder The method of performing in-situ dynamic 3D reconstruction of a sample using a multi-degree-of-freedom sample holder includes the following steps:

S1. Making the above sample holder nozzle, putting the sample into the head end of the sample holder, and inserting the sample holder into the TEM;

S2. Adjusting a feature point on the TBO sample area to align with the sample holder axis;

S3. Making the rotating shaft to rotate 180° cumulatively, and taking a photo every 1°;

S4. Importing the photos obtained in step S3 into a computer for three-dimensional reconstruction. Among them, three-dimensional reconstruction means that a mathematical model suitable for computer representation and processing is established for the three-dimensional objects, which belongs to the prior art.

FIG. 23 is a performance comparison list of the present invention and existing sample holders. This is currently the only sample holder with four degrees of freedom.

In the absence of any elements or limitations specifically disclosed herein, the invention shown and described herein can be realized. The terms and expressions used herein are for explanatory terms rather than limitations, and it is not intended to exclude any equivalents of the features shown and described or parts thereof from the use of these terms and expressions, and it should be aware that various modifications are possible within the scope of the present invention. Therefore, it should be understood that although the present invention has been specifically disclosed through various embodiments and optional features, the modifications and variations of the concepts described herein can be adopted by those of ordinary skill in the art, and it is considered that these modifications and variations fall within the scope of the present invention as defined by the appended claims. The contents of the articles, patents, patent applications, and all other documents and electronically available information described or recorded in this article are incorporated herein for reference in their entirety to the extent that each individual publication is specifically and separately pointed out for reference. The applicant reserves the right to incorporate any and all materials and information from any such articles, patents, patent applications or other documents into this application.

What is claimed is:

1. A multi-degree-of-freedom sample holder, comprising a housing and a rotating shaft, wherein a frame is provided between the housing and the rotating shaft, and the frame is coaxial with the housing and the rotating shaft;
   the housing is provided with an inner chamber, the rotating shaft is positioned on the inner chamber of the housing and a self-positioning mechanism is arranged in the inner chamber;
   the self-positioning mechanism comprises a supporting block and a pressing plate, the supporting block is provided with a symmetrical inclined plane, and the inclined plane of the supporting block is in contact with the rotating shaft; the pressing plate is provided with a flat plate, and two sides of the flat plate are symmetrically provided with slopes; the rotating shaft is positioned between the supporting block and the pressing plate; a wear-resistant layer is arranged on the surface of the flat plate that is contact with the rotating shaft;
   the pressing plate is provided with a pair of mounting wings, and fixing holes are arranged on the mounting wings, and the mounting wings are assembled to the frame through an elastic mounting assembly.

2. The multi-degree-of-freedom sample holder according to claim 1, wherein the elastic mounting assembly is composed of a screw rod and a spring, the spring is sleeved on the shaft of the screw rod, and the spring is positioned between the mounting wing and the nut of the screw rod.

3. The multi-degree-of-freedom sample holder according to claim 1, wherein the frame is provided with a matching portion that is in clearance fit with the inner wall of the housing, a receiving groove for accommodating the rotating shaft, and a mounting portion for carrying accessories, and the receiving groove is provided with a symmetrical inclined plane, the mounting portion is fixedly provided with a connecting circuit board, and the connecting circuit board is provided with a connecting wire.

4. The multi-degree-of-freedom sample holder according to claim 1, wherein the sample holder is provided with a rotating shaft drive assembly, the frame is provided with a receiving groove for receiving the rotating shaft, and the receiving groove is fixed with a supporting block, and the receiving groove is arranged in multiple sections along the axis direction of the frame; a mounting chamber for accommodating a rotating shaft drive assembly is arranged on the frame, and the receiving groove and the mounting chamber are spaced apart.

5. The multi-degree-of-freedom sample holder according to claim 4, wherein the rotating shaft drive assembly includes a drive unit, each drive unit has a connecting circuit board for current flow, and the connecting circuit board is a printed circuit board, the connecting circuit board is provided with a circuit electrically connected to the rotating drive assembly; each rotating shaft drive assembly is corresponding to an adapter circuit board, the adapter circuit board is a printed circuit board, and the adapter circuit board is provided with a connecting circuit; the current of the connecting circuit board is collected in the adapter circuit board.

6. The multi-degree-of-freedom sample holder according to claim 5, wherein the connecting circuit board is electrically connected to the adapter circuit board by a wire; and, or the adapter circuit board is fixed on the frame, and the rotating shaft is positioned below the adapter circuit board.

7. The multi-degree-of-freedom sample holder according to claim 4, wherein the frame is cylindrical, a groove is cut on one side of the frame, and the groove runs through the axis of the frame, and the receiving groove and the mounting cavity are both positioned on the groove; a notch is provided at the position where the connecting circuit board is placed using an arc surface of the frame as a bottom and an opening of the groove as a top, and the notch is formed by cutting part of the frame wall from the top to the bottom.

8. The multi-degree-of-freedom sample holder according to claim 1, wherein the frame is provided with a connecting circuit board and a notch, the width of each connecting circuit board is less than or equal to the wall thickness of the frame, and the connecting circuit board is fixed on the top surface of the notch with screws; and, or the plane of the frame wall where adapter circuit board is arranged is higher than the plane of the frame wall where the connecting circuit board is arranged.

9. The multi-degree-of-freedom sample holder according to claim 1, wherein the frame is provided with a mounting threaded hole, and the threaded hole penetrate through the frame from top to bottom.

10. The multi-degree-of-freedom sample holder according to claim 1, wherein a magnet is provided at the end of the rotating shaft, the frame is provided with a lead-out circuit board, and the frame is opened with a notch, the lead-out circuit board includes a bending portion, and the bending portion is positioned in the notch, the magnetic field sensor is fixed on the bending portion.

11. The multi-degree-of-freedom sample holder according to claim 10, wherein the lead-out circuit board includes a plane portion, the plane portion and the bending portion are bent to cover the frame, and the plane portion is connected with the bending portion by a wire, and the magnetic field sensor is connected with the bending portion through solder.

12. The multi-degree-of-freedom sample holder according to claim 11, wherein the lead-out circuit board is a printed circuit board; the plane portion is perpendicular to the bending portion, and the magnetic field sensor is opposite to the magnet.

13. The multi-degree-of-freedom sample holder according to claim 1, wherein the frame is provided with an optical fiber groove; the optical fiber groove is opened on the side of the frame, and the optical fiber groove penetrates through the frame axially.

14. The multi-degree-of-freedom sample holder with an optical fiber according to claim 13, wherein the head portion of the sample holder has a front-end circuit board, the front-end circuit board has a guiding plane for guiding the optical fiber, and the front-end circuit board is engaged with the optical fiber groove, and the guiding plane is flush with the optical fiber groove.

15. A multi-degree-of-freedom sample holder with a rotating shaft drive assembly, comprising a frame and a rotating shaft, at least one set of rotating shaft drive assembly is arranged between the frame and the rotating shaft, and each set of the rotating shaft drive assembly includes a drive unit, and the drive unit includes a substrate and a piezoelectric ceramic sheet;

the substrate is a printed circuit board, the substrate has a ceramic sheet area and an electrode area, the piezoelectric ceramic sheet is stacked and bonded to the ceramic sheet area, a conductive coating is evenly coated on the surfaces at both sides of the piezoelectric ceramic sheet, the conductive coating is an upper-layer electrode and a lower-layer electrode; the electrode area is provided with multiple circuits, and the circuits are electrically connected to the conductive coating on the surface of the piezoelectric ceramic sheet;

the ceramic sheet area is provided with one piezoelectric ceramic sheet, or is stacked with at least two piezoelectric ceramic sheets, when there are at least two piezoelectric ceramic sheets, the telescopic direction of the piezoelectric ceramic sheets is different from each other;

the substrate is provided with a recess and a pair of mounting holes, the mounting holes are used as the front and rear ends of the substrate, the ceramic sheet area and the electrode area are positioned in the center of the substrate, the recess is positioned at the front and rear ends of the substrate and around the mounting holes; the ceramic sheet area and the electrode area are positioned on the left and right sides of the substrate;

when there are at least two piezoelectric ceramic sheets, the lower-layer electrode of the lowermost piezoelectric ceramic sheet is in direct contact with the ceramic sheet area on the substrate, and is connected to the electrode area on the substrate through the circuit on the ceramic sheet area; the upper-layer electrode surface of the uppermost piezoelectric ceramic sheet is provided with an area A and an area B; the drive unit is provided with a wear-resistant sheet, and the wear-resistant sheet is pasted to the area A; the area B is electrically connected to an adapter cable; one end of the adapter cable is electrically connected to the electrode area on the substrate.

16. The sample holder with a rotating shaft drive assembly according to claim 15, wherein the adapter cable is soldered to the area B; or, the adapter cable is bonded to area B with a conductive adhesive.

17. The multi-degree-of-freedom sample holder with a rotating shaft drive assembly according to claim 16, wherein, when there are at least two piezoelectric ceramic sheets, the upper-layer electrode of each layer of piezoelectric ceramic sheet other than the uppermost piezoelectric ceramic sheet has an overlapping area and an exposed area; the overlapping area is electrically connected to the lower-layer electrode of the upper layer of piezoelectric ceramic sheet of this layer of piezoelectric ceramic sheet; the exposed area is electrically connected to an adapter cable; one end of the adapter cable is electrically connected to the electrode area on the substrate; the adapter cable is soldered to the exposed area; or, the adapter cable is bonded to the exposed area with a conductive adhesive; and, or the adapter cable is soldered to the electrode area on the substrate.

18. The multi-degree-of-freedom sample holder with a rotating shaft drive assembly according to claim 17, wherein the drive unit comprises a first electrode plate, a second electrode plate and a third electrode plate, and the piezoelectric ceramic sheet includes a first piezoelectric ceramic sheet and a second piezoelectric ceramic sheet; the sequence of mounting is the first electrode plate, the first piezoelectric ceramic sheet, the second electrode plate, the second piezoelectric ceramic sheet, and the third electrode plate successively; the shear deformation direction of the first piezoelectric ceramic sheet is different from the shear deformation direction of the second piezoelectric ceramic sheet; the third electrode plate is close to the rotating shaft but not in contact with the rotating shaft.

19. The multi-degree-of-freedom sample holder with a rotating shaft drive assembly according to claim 18, wherein the first electrode plate is adhesively fixed on the substrate, the substrate is an insulating layer, and the third electrode plate is provided with a wear-resistant layer that is in contact with the rotating shaft.

20. A multi-degree-of-freedom sample holder having an electrostatic lead-out function, the sample holder is provided with a nanopositioner, the nanopositioner includes a pressing component assembly, and the pressing component assembly includes at least two pressing components and an elastic connecting component, and a nano-actuator provided with a casing for loading samples, the casing is provided with a pre-tightening screw for locking samples, wherein the tail end of the nano-actuator is provided with an electrostatic lead-out component, the pre-tightening screw and the electrostatic lead-out component are conductive, and the nano-actuator is provided with an electrical path that is in communication with the pre-tightening screw and the electrostatic lead-out component, the electrostatic lead-out component is connected with the wire;

the electrical path includes a pressing component assembly and a connecting wire, the pressing component assembly includes a first pressing component and a second pressing component, both the first pressing component and the second pressing component are conductors, the electrostatic lead-out component is positioned on the second pressing component, at least one elastic connecting component is provided between the first pressing component and the second pressing component, the elastic connecting component includes a screw rod and a spring, the spring is sleeved on the screw rod, and both the screw rod and the spring are conductors;

the electrostatic lead-out component is a conductive screw.

21. The multi-degree-of-freedom sample holder having an electrostatic lead-out function according to claim 20, wherein the second pressing component is provided with a screw hole mating with the conductive screw, and the nut at the head portion of the conductive screw is in the direction away from the first pressing component, the wire is positioned between the nut at the head portion of the conductive screw and the second pressing component.

22. The multi-degree-of-freedom sample holder having an electrostatic lead-out function according to claim 21, wherein the screw rod portion of the conductive screw is positioned in the second pressing component; and, or the tail portion of the conductive screw is fixed with the second pressing component by spot welding; and, or the head portion of the conductive screw is exposed on the second pressing component.

\* \* \* \* \*